US006922799B2

(12) United States Patent
Koike

(10) Patent No.: US 6,922,799 B2
(45) Date of Patent: Jul. 26, 2005

(54) SEMICONDUCTOR MEMORY DEVICE AND TESTING SYSTEM AND TESTING METHOD

(75) Inventor: Hiroki Koike, Tokyo (JP)

(73) Assignee: NEC Corporation, Tokyo (JP)

( * ) Notice: Subject to any disclaimer, the term of this patent is extended or adjusted under 35 U.S.C. 154(b) by 554 days.

(21) Appl. No.: 09/824,751

(22) Filed: Apr. 4, 2001

(65) Prior Publication Data

US 2001/0055229 A1 Dec. 27, 2001

(30) Foreign Application Priority Data

Apr. 5, 2000 (JP) ....................................... 2000-103568

(51) Int. Cl.[7] .......................... G11C 29/00; G11C 16/00
(52) U.S. Cl. ........................................ 714/718; 365/201
(58) Field of Search ........................... 714/718; 365/201

(56) References Cited

U.S. PATENT DOCUMENTS

| | | | | |
|---|---|---|---|---|
| 5,254,482 A | | 10/1993 | Fisch | |
| 5,519,652 A | | 5/1996 | Kumakura et al. | |
| 5,535,167 A | | 7/1996 | Hazani | |
| 5,661,690 A | | 8/1997 | Roohparvar | |
| 5,675,546 A | | 10/1997 | Leung | |
| 5,745,409 A | | 4/1998 | Wong et al. | |
| 6,009,022 A | * | 12/1999 | Lee et al. | 365/189.09 |
| 6,091,655 A | * | 7/2000 | Yamada et al. | 365/210 |
| 6,229,728 B1 | * | 5/2001 | Ono et al. | 365/145 |
| 6,262,910 B1 | * | 7/2001 | Takata et al. | 365/145 |
| 6,449,190 B1 | * | 9/2002 | Bill | 365/185.2 |
| 6,597,236 B1 | * | 7/2003 | Ooishi et al. | 327/541 |

FOREIGN PATENT DOCUMENTS

| | | | |
|---|---|---|---|
| EP | 0 400 184 A1 | 12/1990 | |
| EP | 0 486 901 A2 | 5/1992 | |
| EP | 0 953 989 A2 | 11/1999 | |
| EP | 0 986 066 A2 | 3/2000 | |
| JP | 57-200993 | 12/1982 | |
| JP | 59-198594 | 11/1984 | |
| JP | 64-8579 | 1/1989 | G11C/7/00 |
| JP | 5-28782 | 2/1993 | G11C/16/06 |
| JP | 5-129553 | 5/1993 | H01L/27/108 |
| JP | 7-211093 | 8/1995 | G11C/17/18 |
| JP | 8-241589 | 9/1996 | G11C/11/407 |
| JP | 8-313594 | 11/1996 | |
| JP | 9-282892 | 10/1997 | G11C/11/56 |
| JP | 10-233100 | 9/1998 | G11C/29/00 |
| JP | 10-326495 | 12/1998 | G11C/16/06 |
| JP | 2001-148200 | 5/2001 | |

OTHER PUBLICATIONS

Abstract of Japanese Patent Application No. 09–097496, published Apr. 8, 1997.

(Continued)

*Primary Examiner*—Albert Decady
*Assistant Examiner*—Esaw Abraham
(74) *Attorney, Agent, or Firm*—Sughrue Mion, PLLC

(57) ABSTRACT

The object of the present invention is to provide a semiconductor memory device wherein analog data signal potential read out from a memory cell to bit-line (bit-line read-out potential) can be measured precisely. In this invention, a sense part circuit block 140 differentially amplifies data signal occurring on one of a pair of bit-lines (for example, bit-line BLNk, BLTk) in a memory cell array 110, and reference signal occurring on another of the pair, and data is read out. Bit-lines BLN1, BLT1, -, BLNn, BLTn are connected to a reference potential setup circuit block 150. Reference potential setup circuit 150 sets up potential assigned from outside of the device as potential of reference signal on bit-line. Bit-line read-out potential is indirectly obtained from the differential amplification result by controlling the reference potential with the reference potential setup circuit block 150.

13 Claims, 14 Drawing Sheets

OTHER PUBLICATIONS

J. Choy et al., "Differential Sense Amplifier Reference Current Mode for Production Screening", Motorola Technical Developments, vol. 40, (Jan. 2000), pp. 3–7.

Patent Abstracts of Japan (Japanese Patent Application No. 11–176195, published Jul. 2, 1999).

Byung–Gil Jeon et al., "A novel cell charge evaluation scheme and rest method for 4 mb nonvolatile ferroelectric RAM" ICVC '99. 6th International Conference in VLSI and CAD (Cat. No. 99 EX361), ICVC '99 6TH International Conference in VLSI and CAD, Seoul, South Korea, Oct. 26–27 1999, pp. 281–284, XP002271012 1999, Piscataway, NJ, USA IEEE, USA ASBN: 0–7803–5727–2.

Byung–Gil Jeon et al.: "A 0.4 mu , 3.3 V ITIC 4 Mb nonvolatile ferroelectric RAM with fixed bit–line reference voltage scheme and data protection circuit", 2000 IEEE International Solid–State Circuits Conference. Digest of Technical Papers (Cat. No. 00CH37056), 2000 IEEE International Solid–State Circuits Conference. Digest of Technical Papers, San Francisco, CA, USA, IEEE, USA ISBN: 0–7803–5853–8.

* cited by examiner

Row decoder
Dummy memory cell ccontrol circuit
Bit-line precharge control signal
Sense amp control circuit
Address predecoder
Column decoder
Sense amp

PBL
VDWL
VWL
VPL
SAE
YSW
VBL
DWLN
DWLT
WL2
PL2
YSW2
BLN2
BLT2

200
System control part
210
Control signal generation part
220
Data generation part
230
Address generation part
240
Reference potential generation part
250
Determination part
260
Storage part
270
Statistica process part
280
VBLMR
COMP
VREF
SEL
Ai
DATA
CNTMEM
DIN
DOUT
Ferroelectric memory
100

CNTSH
VBL1
VBLk
VBLn
310
300
SH1
Sample hold circuit
SHk
SHn
120
110
180
Sense part control circuit
140
190
Input/output buffer circuit
DOUT
DIN
Sense part circuit block
Row decoder
Address predecoder
Control circuit
130
170
160
Ai
CNTMEM (a)
CNTSW
BL
SW10
C10
OP10
CNTOPA
VBLX
(b)
CNTSW
BL
SW21
C21
OP21
CNTOPA
CNTSW
SW22
C22
OP22
CNTOPA
VBLX 400
210
System control part
220
Control signal generation part
230
Data generation part
240
Address generation part
410
Signal hold circuit control part
420
AD conversion part
270
Storage part
280
Statistical process part
VBLMR
VBLX(D)
VBLX(SH)
CNTOPA
CNTSW
Ai
DATA
DIN
CNTMEM
Ferroelectric memory
300

SEMICONDUCTOR MEMORY DEVICE AND TESTING SYSTEM AND TESTING METHOD

BACKGROUND OF THE INVENTION

1. Field of the Invention

The invention relates a semiconductor memory device having a function for measuring potential of data signal read out from a memory cell to a bit-line, a testing system and a testing method of the same.

2. Description of the Related Art

Semiconductor memory devices (semiconductor memories) such as dynamic random access memories (DRAM), static random access memories (SRAM), flash memories (Flash Memory), and ferroelectric memories (ferroelectric random access memory, or FeRAM) have been known. Specifications of the semiconductor memory devices such as circuit design, fabrication process, or reliability strongly depends on performance of the memory cell storing one bit of data, which is a unit of the memory. Therefore, when a semiconductor memory device is being developed, an approach is employed in which the performance required for a commercial product is improved through repeat of test fabrication with evaluating operation performance of the memory cell and feeding back the performance evaluation result to the device structure, fabrication process and circuit design.

In operation performance evaluation of above mentioned memory cells, read-out potential taken by reading out data pre-written to a memory cell to a bit-line, the data input/output line of the memory cell, which will be referred as "bit-line read-out potential" hereafter, is important information. For example, read-out potential after a certain time passed since data written to a memory cell, is a parameter representing a data hold performance of the memory cell. A read-out potential after repeat of writing to and reading from a memory cell is a parameter representing a repeat operation resistance.

Therefore, detailed evaluation of basic operation performance and reliability individual memory cells and yield of the memory cells in the whole set can be conducted by obtaining bit-line read-out potential with varying conditions such as power source potential or ambient temperature.

Bit-line read-out potential that is an internal signal of a semiconductor memory device is thus very important information for development of the semiconductor memory device. Techniques to measure precisely the internal signal of the semiconductor device are thus effective.

A ferroelectric memory will be described as a conventional semiconductor memory device, and a conventional technique to measure internal signal of a semiconductor memory device will be then described.

Circuitry and operation of ferooelectric memories are disclosed in detail, for example, in Japanese Patent Laid-Open No. 6-324558 and 10-233100. FIG. 1 shows arrangement of a memory cell array of a conventional ferroelectric memory and its periphery circuit, and FIG. 2 shows a timing chart of its operation. In FIG. 1, lines represented by a thin line are single line, and lines represented by a thick line are a set of multiple lines.

First, in FIG. 1, a memory cell array 110 is arranged by memory cells MCjk consisting of a transistor and a ferroelectric capacitor, so-called 1T/1C type, to a array with m rows and n columns, where "J" is a suffix representing a row number, having integer of 1 to m, and "k" is a suffix representing a column number, having integer of 1 to n. In following explanation, this representation using such suffix will be used in suitable manner. For example, a ward-line WLj represents any one of ward-line WL1 to WLm, and bit-line BLNk, BLTk represents any pair of BLN1, BLT1, -, BLNn, BLTn, in which they have a same number (for example, BLN1, BLT1).

A plurality of word-lines WL1–WLm and plate-lines PL1–PLm are wired such that the lines extend in row direction of the memory cell array 110, and a plurality of bit-lines BLTN1, BLT1, -, BLNn, BLTn are wired such that the lines extend in column direction perpendicular to the ward-lines and plate-lines. The word-lines WLj and plate-lines PLj are lines for selecting a memory cell belonging to the row of row-number j and are driven selectively by a row decoder 120 described below. The gate terminal of the transistor in memory cell MCjk is connected to word-line WLj and the drain terminal is connected one of a pair of bit-line, BLNk or BLTk described below. One electrode of the ferroelectric capacitor of the memory cell is the source terminal of the transistor of the memory cell, and the other electrode is connected to plate-line PLj.

Bit-lines BLNk, BLTk belonging to row-number k form a pair, and memory cells connected to word-lines adjacent to each other are connected to the pair of bit-lines BLNk, BLTk, respectively, and they are adapted such that memory cells connected respectively bit-lines forming a pair can not be selected simultaneously. Sense amps SA1 to San for amplifying data signal, which is read from memory cells for each pair of bit-line BLNk, BLTk, is connected to bit-lines BLN1, BLT1, -, BLTn, BLTn. The sense amps SA1–SAn are controlled with sense amp activation signal SAE generated at a sense amp control circuit 181 described below.

Bit-line precharge circuits PBL1–PBLn for initializing bit-line potential in read-out are connected to bit-lines BLN1, BLT1 to BLNn, BLTn, respectively for each pair of bit-line BLNk, BLTk. These bit-line precharge circuits PBL1–PBLn are controlled with bit-line precharge signal PBL generated by a bit-line precharge control circuit 182 described below so as to initialize each bit-line potential to the ground potential.

Dummy memory cells DCN1, DCT1, -, DCNn, DCTn are connected to bit-line BLN1, BLT1, -, BLN1, BLTn respectively. The dummy memory cells are used for generating reference potential required in read-out step, and have an arrangement equivalent to above mentioned 1T/1C memory cell MCjk. Dummy memory cells DCN1–DCNn correspond to memory cells connected to bit-line BLN1–BLNn, and are connected to a dummy word-line DWLN. Dummy memory cells DCT1 to DCTn correspond to memory cells connected to bit-line BLT1–BLTn, and are connected to a dummy word-line DWLT.

Column selection transfer gates YST1–YSTn are connected to bit-lines BLN1, BLT1–BLNn, BLTn, respectively for each pair of bit-line BLNk, BLTk, and bit-line BLN1, BLT1, -, BLNn, BLTn are selectively connected to a DB line (complimentary signal line) though the column selection transfer gates YST1–YSTn. Column selection line YSW1–YSWn from a column decoder 130 described later are connected to the column selection transfer gates YST1–YSTn.

An address predecoder 160 predecodes address signal Ai that is input from outside of the device, to generate row address predecode signal XPa and column address predecode signal YPb. The row decoder 120 drives selectively the word-lines WL1–WLm based on the row address predecode signal XPa generated by the address predecoder 160, so as to select a row of memory cells. In this embodiment 1, the row decoder 120 includes a function for selecting the plate-line PL1–PLm. The column decoder 130 drives selectively the column selection lines YSW1–YSWn based on column address predecode signal YPb generated by the address predecoder 160, so as to select a column of memory cells (a group of memory cell connected to a pair of bit-line BLNk, BLTk). In addition to the above described components, an input/output buffer circuit for data (not shown specifically) is also connected the data line DB.

Next, with reference to FIG. 2, operation of the ferroelectric memory shown in FIG. 1 will be described in the case where data reading and writing are performed with a memory cell MC22 being selected.

First, the ferroelectric memory is in waiting states. In the waiting states, all of the word-lines WL1–WLm, plate-lines PL1–PLm, dummy word-line DWLN, DWLT, and column selection lines YSW1–YSWn are driven to low-level, and the sense amp activation signal SAE is set to low-level. All of memory cells MC11–MCmn, dummy memory cells DCN1, DCT1, -, DCNn, DCTn, sense amps SA1–SAn, and column selection transfer gates YST1–YSTn are thus made in inactivated states. Bit-line precharge signal PBL is set to high-level, and bit-line precharge circuit PBL1–PBLn are made in activated states. Thus, potentials of bit-line BLN1, BLT1, -, BLNn, BLTn are driven to the ground potential by bit-line precharge circuits PBL1–PBLn, and all the bit-lines are precharged to the ground potential.

When writing operation or reading operation is performed from the above waiting state, first, bit-line precharge signal PBL is set to low-level. The bit-line precharge circuits PBL1–PBLn are thus inactivated, and all the bit-line become in floating states. At this point, since the bit-line BLN1, BLT1, BLNn, BLTn have been precharged to the ground states before, potential of each bit-line maintains low-level (the ground potential) while influence of leak or the like is negligible.

Memory cell 22 is then selected. Specifically, based on address signal Ai assigned from the outside, word-line W2 is driven to high-level, and plate-line PL2 is driven to high-level. The high-level potential of the word-line WL2 is typically an elevated potential about Vtn higher than the power source potential because of necessity for compensating the amount of threshold potential of the transistors forming the memory cells. The high-level of the plate-line PL2 is typically the source potential.

The word-line WL2 and plate-line PL2 is driven to high-level to make all memory cells MC21, MC22, . . . , MC2n in selection states. In other words, the plate-line PL2 is driven to high-level to generate a potential difference between the plate-line PL2 and the bit-lines BLT1–BLTn. A potential difference thus occurs between electrodes of ferroelectric capacitors in the memory cells belonging to the row number j of "2", and electric charge corresponding to the potential difference is output from the ferroelectric capacitors to the bit-line BLT1–BLTn. As a result, bit-line read-out potentials, which are potentials of data signals, occur on the bit-lines BLT1–BLTn. The bit-line read-out potential has typically an analog value between the source potential and the ground potential.

On the other hand, reference potentials for determining if the bit-line read-out potentials occurring on the bit-lines BLT1–BLTn correspond to data "0" or data "1" are generated on bit-line BLN1–BLNn pairing with bit-line BLT1–BLTn. In this case, the reference potentials occur on the bit-lines BLN1–BLNn by driving the dummy word-line DWLN to high-level to select dummy cells DCN1–DCNn.

In contrast, when determination for data corresponding to bit-line read-out potentials on the bit-lines BLN1–BLNn is made, the dummy word-line DWLT is driven to high-level to select dummy memory cells DCT1–DCT so as to generate reference potentials on the bit-lines BLT1–BLTn. Methods for generating such a reference potential are disclosed in detail, for example, in Japanese Patent Laid-Open No. 10-233100 and Japanese Patent Laid-Open No. 9-97496.

Read-out potentials are thus output to the bit-lines BLT1–BLTn from memory cells MC21–MC2n belonging to the row number j of "2", and reference potentials are output to the bit-line BLN1–BLNn from dummy memory cells DCN1–DCNn. After that, the sense amps SA1–SAn are activated by making the sense amp activation signal SAE high-level, and the potential difference between bit-line BLNk and bit-line BLTk paring with each other is differentially amplified.

At this point, in the case of data read-out operation, the column selection line YSW2 is driven to high-level to activate the column selection transfer gate YST2. Electrical connection between a pair of bit-lines BLN2, BLT2 and the data-line DB is thus made to transfer the differentially amplified data signal on the pair of bit-lines BLN2, BLT2 to a data output buffer circuit (not shown). This data output buffer circuit outputs data to outside. In the case of data write operation, data is input from outside by a data input buffer circuit (not shown). Potential corresponding to data is output through the data-line DB to write the data to the pair of bit-lines BLN2, BLT2 to write the data to the memory cell MC22.

The data read-out operation described above is so-called destructive read-out operation in which stored data in the memory cell is destroyed during data read-out step. When stored data is to be maintained after read-out, the data is rewritten to the memory cell. In the ferroelectric memory, data writing to the memory cell is implemented by following operations:

(1) If rewriting data "0", starting from status where the bit-line is driven to low-level and the plate-line is driven to high-level, the plate-line is driven to low-level and the voltage applied to the ferroelectric capacitor is made to zero.

(2) If rewriting data "1", starting from status where the bit-line is driven to high-level and the plate-line is driven to low-level, the bit-line is driven to low-level and the voltage applied to the ferroelectric capacitor is made to zero.

With reference to the timing chart in FIG. 2, data writing operation will be further described in detail. For example, in the case of a memory cell coupled with the bit-line BLT2 that is low-level after data amplification by the sense amp SA2, starting from status where the plate-line PL2 has been driven to high-level and the bit-line has been driven to low-level beforehand, voltage applied to the ferroelectric capacitor become zero when the plate-line PL2 is driven to low-level. Therefore, after the column selection line YSW2 is driven to low-level, the data writing is completed at the time when the plate-line PL2 is driven to low-level.

In the case of a memory cell coupled with the bit-line BLN2 that is driven to high-level after data amplification by the sense amp SA2, when the plate-line PL2 is driven to low-level, the bit-line BLN2 is driven to high-level, and next, when the bit-line BLN2 is driven to low-level, voltage applied to the ferroelectric capacitor in the memory cell become zero. Therefore, the data rewriting is completed at the time when the sense amp activation signal SAE is made low-level and the bit-line precharge signal PBL is made high-level and the bit-line potential is made to the ground potential (low-level).

After completion of the data rewriting, the word-line WL2 is driven to low-level to make back the memory cell no-selection status. One cycle of read-out operation or writing operation for the ferroelectric memory is thus completed.

The operation of the ferroelectric memory described so far is operation for storing one bit of data for a memory cell of 1T/1C type memory cells, and it is so-called "1T/1C type operation method". In this operation method, reference potential is needed in read-out operation. In contrast, there is a operation method wherein one bit of data is stored with two 1T/1C type memory cells, which is so-called "2T/2C type operation method".

In the 2T/2C type operation method, one memory cell of 1T/1C type memory cells connected to bit-line BLNk and one memory cell of 1T/1C type memory cells connected to bit-line BLTk are formed in a pair, with the pair of memory cells being 1-bit memory unit. This will be explained by using FIG. 1. Pairs of memory cells as a 1-bit memory unit is set up, such as, for example, memory cell MC11 and memory cell MC21 for a pair of bit-line BLN1, BLT1, memory cell MC12 and memory cell MC22 for a pair of bit-line BLN2, BLT2, and so on. Data that have opposite polarization to each other (complementary data) are held in the pair of memory cells.

For example, the status where high-level data signal occurs on the bit-line BLTN1 and low-level data signal occurs in the bit-line BLT1, is adapted to be data "0", and the opposite status is adapted to be data "1". One bit of data is thus stored by the two 1T/1C type memory cells. In this operation method, differential amplification operation with the sense amp can be performed without requiring reference potential used in the case of the 1T/1C type operation method above-mentioned, since complementary data signals depending on the data content are output onto bit-lines BLNk, BLTk from the memory cell itself.

As explained so far, bit line read-out potential for ferroelectric memory is analog value, either in the 1T/1C type operation or in the 2T/2C typed operation. Therefore, in the case of measuring bit-line read-out potential, a method wherein analog potential value is measurable, must be used. This requirement is same for other semiconductor memory devices, not limited to ferroelectric memory.

Next, conventional techniques for measuring internal signals in a semiconductor memory device, including bit-line read-out potential will be described. As such conventional techniques, followings are known:

(1) Japanese Patent Laid-Open No. 8-241589 discloses a method for contacting a probe to a node with signal for measured object to directly measure the potential of the signal.

(2) Japanese Patent Laid-Open No. 5-129553 discloses a method for using an electron beam (EB) tester to measure.

(3) Japanese Patent Laid-Open No. 10-233100 discloses a semiconductor memory device comprising a bit-line potential detection means. A technique disclosed in the application is such that bit-line read-out potential is measured by seeing if the bit-line read-out potential to be measured exceeds the sensitivity of the sense amp, which is the potential disabling normal amplification operation with the sense amp.

However, according to the conventional techniques above described for measuring internal signals have following disadvantages.

(1) In the method using a probe disclosed in the Japanese Patent Laid-Open No. 8-24158, the operation needs much time since the probe has to be moved onto bit-lines in a memory cells formed on surface of a semiconductor chip, by controlling a manipulator or the like. Additionally, when bit-line read-out signals occurring on a plurality of bit-lines are measured, the operation needs much longer time since it is needed to move the probe onto every bit-lines. In order to eliminate these disadvantages, there may be a method wherein probes are moved to all the bit-lines simultaneously, however a dedicated measurement jig should be prepared since it is very difficult to move the plurality of probes onto a plurality of bit-lines fine-processed.

(2) In the methods using EB tester disclosed Japanese Patent Laid-Open No. 5-129553, there is a problem of increased cost because of high price of the EB tester equipment. Furthermore, there is another problem that it is difficult to measure absolute value of measured object potential since EB tester only obtains relative value due to the tester's characteristic.

(3) In the technique disclosed in Japanese Patent Laid-Open No. 10-233100, there is a problem that the technique is not suitable to measurement of analog bit-line read-out potential since it only determines if the bit-line read-out potential of a measured object exceeds the sense amp sensitivity.

According to the conventional techniques above mentioned, there is a difficulty in measuring analog bit-line read-out potential.

There is also a particular problem on measuring bit-line read-out potential.

The problem is that, once large capacitive load or current load is connected to the bit-line itself, due to the load's influence, the potential of a measured object varies, resulting in different potential from the true bit-line read-out potential. Therefore, it is needed to limit the capacitive load added to a bit-line, which is came from a measurement part to measure potential of bit-line, within, for example, less than 10 percent of the parasitic capacitance, which the bit-line has in itself.

Another problem is that, in the case of a semiconductor memory device such as dynamic random access memory or ferroelectric, where data signal is read out from memory cell to a bit-line in floating state, it is needed to limit influence of leak current when bit-line read-out potential is measured.

FIG. 3 shows a structure of a memory cell that a ferroelectric memory has, and an example of leak current that affects bit-line read-out potential.

FIG. 3(*a*) shows a circuitry of a memory cell, and FIG. 3(*b*) shows schematically a cross section of a memory cell. In FIGS. 3(*a*) and (*b*), transistor Tr is used to make electrical connection between storage node M and bit-line BL depending on potential of word-line WL, and source DS is connected to the storage node M and drain DD is connected to the bit-line BL, and gate GT is connected to ward-line WL. The ferroelectric capacitor Cf is used to hold data, and comprises upper electrode TU and lower electrode TL and the upper electrode TU is connected to the storage node M (the source DS of the transistor Tr), and the lower electrode TL is connected to plate-line PL.

As shown in FIG. 3(*b*), leak current that affects bit-line read-out potential includes various leak currents such as inter-layer leak current i1 through inter-layer insulator film ML to adjacent line, gate oxide film leak current i2 to gate GT of the memory cell, channel leak current i3 in subthreshold region, junction leak current i4 between a diffusion layer (drain DD) and substrate SUB, and leak current i5 to diffusion layer of adjacent memory cell.

Because of the existence of such various leak currents, bit-line read-out potential in floating state varies with time increasing, and when some time is needed to measure bit-line read-out potential, influence of above mentioned leak currents is not negligible and precise measurement of bit-line read-out potential cannot be conducted. It is thought that time acceptable for one measurement step for bit-line read-out potential is generally less than 1 millisecond while it depends on magnitude of the leak current (, which depends on memory cell structure and fabrication process conditions of the semiconductor memory device).

As described above, in order to precisely measure bit-line read-out potential, it is needed to minimize the capacitive load added the bit-line, which attributes to a measurement part, and to limit the influence of the leak currents.

SUMMARY OF THE INVENTION

The invention is intended to solve the problems above described, and provides a semiconductor memory device, and a testing system and a testing method, wherein it is possible to precisely measure analog data signal potential that is read out from a memory cell to a bit-line (bit-line read-out potential).

The invention has following arrangements to solve the above problems.

A semiconductor memory device associated to claim 1 comprises:

a memory cell array formed by arranging memory cells in a matrix (a component corresponding, for example, to memory cell array 110 described later);

a plurality of word-lines for selecting each row of the memory cell array (a component corresponding, for example, to ward-lines WL1–WLm described later);

a plurality of bit-lines for carrying data signal that is output by a memory cell belonging to each column of the memory cell array (a component corresponding, for example, to bit-lines BLN1, BLT1, -, BLNn, BLTn described later);

a reference signal generator part for generating reference signal that is to be a reference signal when amplifying data signal occurring on the bit-line (a component corresponding, for example, to dummy memory cells DCN1, DCT1, -, DCNn, DCTn, and dummy memory cell control circuit 183 described later); and an amplifier part for amplifying the data signal occurring on the bit-line with comparing the reference signal (a component corresponding, for example, to sense amps SA1–SAn, and sense amp control circuit 181 described later), characterized in that the semiconductor memory device has a reference potential setup circuit part for set up potential assigned from outside of the device as potential of the reference signal (a component corresponding, for example, to reference potential setup circuit block 150 described later).

A semiconductor memory device associated to claim 2 is characterized in that in said semiconductor memory device the reference potential setup circuit part comprises;

a transistor in which a drain terminal is connected to a bit-line in the memory cell array that is a line having the reference signal, and the potential assigned from outside of the device is provided to a source signal, and control signal activated in measurement of bit-line potential is provided to a gate terminal (a component corresponding, for example, to transistors T1, T2 described later).

A testing system associated claim 3 for testing a semiconductor memory device comprising a memory cell array formed by arranging memory cells in a matrix (a component corresponding, for example, to memory cell array 110 described later), a plurality of word-lines for selecting each row of the memory cell array (a component corresponding, for example, to word-lines WL1–WLm described later), a plurality of bit-lines for carrying data signal that is output by a memory cell belonging to each column of the memory cell array (a component corresponding, for example, to bit-lines BLN1, BLT1, -, BLNn, BLTn described later), a reference signal generator part for generating reference signal that is to be a reference signal when amplifying data signal occurring on the bit-line (a component corresponding, for example, to dummy memory cells DCN1, DCT1, -, DCNn, DCTn, and dummy memory cell control circuit described later), an amplifier part for amplifying the data signal occurring on the bit-line with comparing the reference signal (a component corresponding, for example, to sense amps SA1–SAn and sense amp control circuit 181 described later), and a reference potential setup circuit part for set up potential assigned from outside of the device as potential of the reference signal (a component corresponding, for example, to reference potential setup circuit block 150 described later), is characterized in that the testing system comprises:

a reference signal control part for generating potential between a source potential and a ground potential with varying the potential in one direction to apply it to the reference potential setup circuit, and controlling the potential of the reference signal (a component corresponding, for example, to reference potential generation part 250 described later);

a control part for controlling a series of steps of generating address to provide it to the semiconductor memory device and reading data signal from the memory cell (a component corresponding, for example, to control signal generation part 220, data generation part 230, and address generation part 240 described later);

a determination part for determining logic value of a data signal amplified by the amplifier part (a component corresponding, for example, to determination part 260 described later);

a storage part for storing potential value of the reference signal when the logic value determined by the determination part is inverted (a component corresponding, for example, to storage part 270 described later); and a statistical process part for statistically processing the value of the potential stored in the storage part (a component corresponding, for example, to statistical process part 280 described later).

A semiconductor memory device associated to claim 4, is characterized in that the device comprises all or some of functions implemented by the control part associated to the testing system (a component corresponding, for example, to control signal generation part 220, data generation part 230, and address generation part 240 described later), a determination part (a component corresponding, for example, to determination part 260 described later), a storage part and a statistical process part (a component corresponding, for example, to storage part 270 described later.

A testing method associated to claim 5 for testing a semiconductor memory device comprising a memory cell array formed by arranging memory cells in a matrix (a component corresponding, for example, to memory cell array 110 described later), a plurality of word-lines for selecting each row of the memory cell array (a component corresponding, for example, to word-lines WL1–WLm described later), a plurality of bit-lines for carrying data signal that is output by a memory cell belonging to each column of the memory cell array (a component corresponding, for example, to bit-lines BLN1, BLT1, -, BLNn, BLTn described later), a reference signal generator part for generating reference signal that is to be a reference signal when amplifying data signal occurring on the bit-line (a component corresponding, for example, to dummy memory cells DCN1, DCT1, -, DCNn, DCTn and dummy memory cell control circuit 183 described later), an amplifier part for amplifying the data signal occurring on the bit-line with comparing it with the reference signal (a component corresponding, for example, to sense amps SA1–SAn and sense amp control circuit 181 described later), and a reference potential setup circuit part for set up a potential assigned from outside of the device as potential of the reference signal a component corresponding, for example, to reference potential setup circuit block 150 described later, is characterized in that the method comprises the steps of:

(a) setting up potential of the reference signal by the reference potential setup circuit part (a step element corresponding, for example, to step S15 described later);

(b) reading out data signal from the memory cell to the bit-line (a step element corresponding, for example, to step S13 described later); and (c) obtaining potential of the reference signal when magnitude relationship between the reference signal and data signal compared by the amplifying part inverts (a step element corresponding, for example, to step S14, S16 described later).

A semiconductor memory device associated to claim 6 comprises a memory cell array formed by arranging memory cells in a matrix (a component corresponding, for example, to memory cell 110 described later), a plurality of word-lines for selecting each row of the memory cell array (a component corresponding, for example, to word-lines WL1–WLm described later), a plurality of bit-lines for carrying data signal that is output by a memory cell belonging to each column of the memory cell array (a component corresponding, for example, to bit-lines BLN1, BLT1, -, BLNn, BLTn described later), and an amplifier part for amplifying the data signal occurring on the bit-line (a component corresponding, for example, to sense amps SA1–SAn and sense amp control circuit 181 described later), characterized in that the device comprises:

a signal hold circuit for taking and holding data signal read out to the bit-line (a component corresponding, for example, to data signal hold circuit block 310 described later).

A semiconductor memory device associated to claim 7, is characterized in that in said semiconductor memory device the signal hold circuit comprises a sample hold circuit (a component corresponding, for example, to sample hold circuits SH1–SHn described later).

A testing system associated to claim 8 for testing a semiconductor memory device comprising a memory cell array formed by arranging memory cells in a matrix (a component corresponding, for example, to memory cell array 110 described later), a plurality of word-lines for selecting each row of the memory cell array (a component corresponding, for example, to word-lines WL1–WLm described later), a plurality of bit-lines for carrying data signal that is output by a memory cell belonging to each column of the memory cell array (a component corresponding, for example, to bit-lines BLN1 BLT1, -, BLNn, BLTn described later), an amplifier part for amplifying the data signal occurring on the bit-line (a component corresponding, for example, to sense amps SA1–SAn and sense amp control circuit 181 described later), and a signal hold circuit for taking and holding signal on the bit-line (a component corresponding, for example, to data signal hold circuit block 310 described later), is characterized in that the system comprises:

a first control part for controlling a series of steps of generating address to provide it to the semiconductor memory device and reading out data signal from the memory cell (a component corresponding, for example, to control signal generation part 220 described later);

a second control part for controlling such that the signal hold circuit takes data signal read out to the bit-line (a component corresponding, for example, to signal hold circuit control part 410 described later);

a conversion part for A/D converting data signal taken to the signal hold circuit (a component corresponding, for example, to AD conversion part 420 described later);

a storage part for storing data signal A/D converted by the data conversion part (a component corresponding, for example, to storage part 430 described later); and a statistical process part for statistically processing data stored in the storage part (a component corresponding, for example, to statistical process part 440 described later).

A semiconductor memory device associated to claim 9 is characterized in that the device comprises all or some of functions implemented by the first and second control parts associated to said testing system (components corresponding, for example, to control signal generation part 220 and signal hold circuit control part 410 described later), a conversion part (a component corresponding, for example, to AD conversion part 420 described later), a storage part (a component corresponding, for example, to storage part 430 described later), and a statistical process part (a component corresponding, for example, to statistical process part 440 described later).

A testing system associated to claim 10 for testing a semiconductor memory device comprising a memory cell array formed by arranging memory cells in a matrix (a component corresponding, for example, to memory cell array 110 described later), a plurality of word-lines for selecting each row of the memory cell array (a component corresponding, for example, to word-lines WL1–WLm described later), a plurality of bit-lines for carrying data signal that is output by a memory cell belonging to each column of the memory cell array (a component corresponding, for example, to bit-lines BLN1, BLT1, -, BLNn, BLTn described later), an amplifier part for amplifying the data signal occurring on the bit-line (a component corresponding, for example, to sense amps SA1–SAn, and sense amp control circuit 181 described later), and a signal hold circuit for taking and holding signal on the bit-line (a component corresponding, for example, to data hold circuit block 310 described later), is characterized in that the system comprises the steps of:

(a) reading out data signal from the memory cell to the bit-line (a step element corresponding, for example, to step S22 described later);

(b) taking data signal read out to the bit-line, to the signal hold circuit(a step element corresponding, for example, to step S23 described later); and (c) reading out potential of data signal taken to the signal hold circuit, to outside (a step element corresponding, for example, to step S24 described later).

The above and other objects, features and advantages of the present invention will become apparent from the following description with reference to the accompanying drawings which illustrate examples of the present invention.

DETAILED DESCRIPTION OF THE PREFERRED EMBODIMENT

Preferred embodiments of the invention will be described with reference to drawings hereafter.

Embodiment 1

Figure 4:
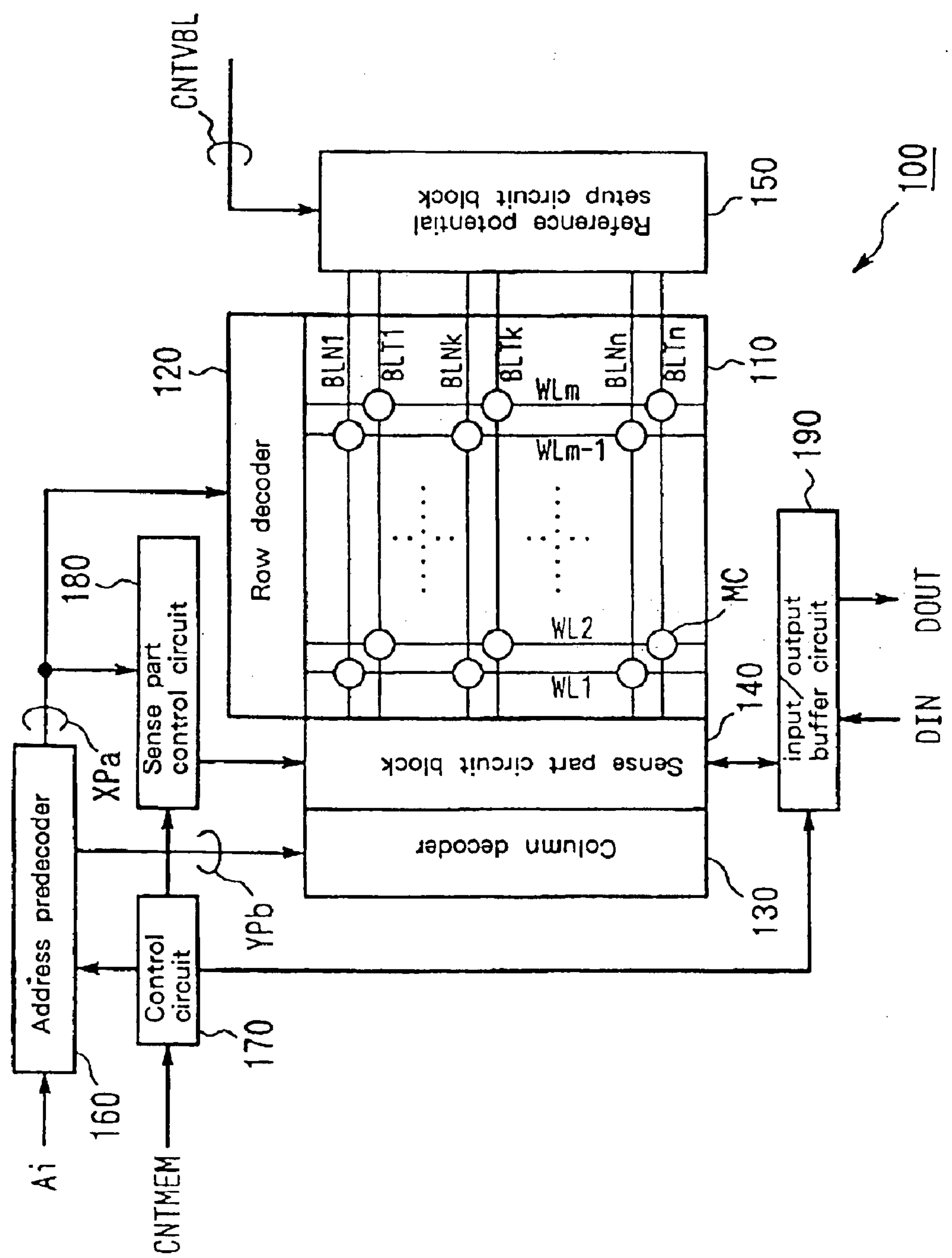
FIG. 4 is a block diagram schematically illustrating the entire arrangement of a ferroelectric memory according to embodiment 1 of the invention.

FIG. 4 shows schematically all arrangement of a ferroelectric memory cell 100 (a semiconductor device) according to the embodiment 1. It is constructed by comprising a reference potential setup circuit block 150 characterizing the embodiment 1 in addition to the ferroelectric memory 100 that is an arrangement related to FIG. 1 above described. Description will be made hereafter for an example of the ferroelectric memory, however the invention can be applied any type of semiconductor memory devices that employ methods to read out data form a memory cell to bit-line.

Figure 1:
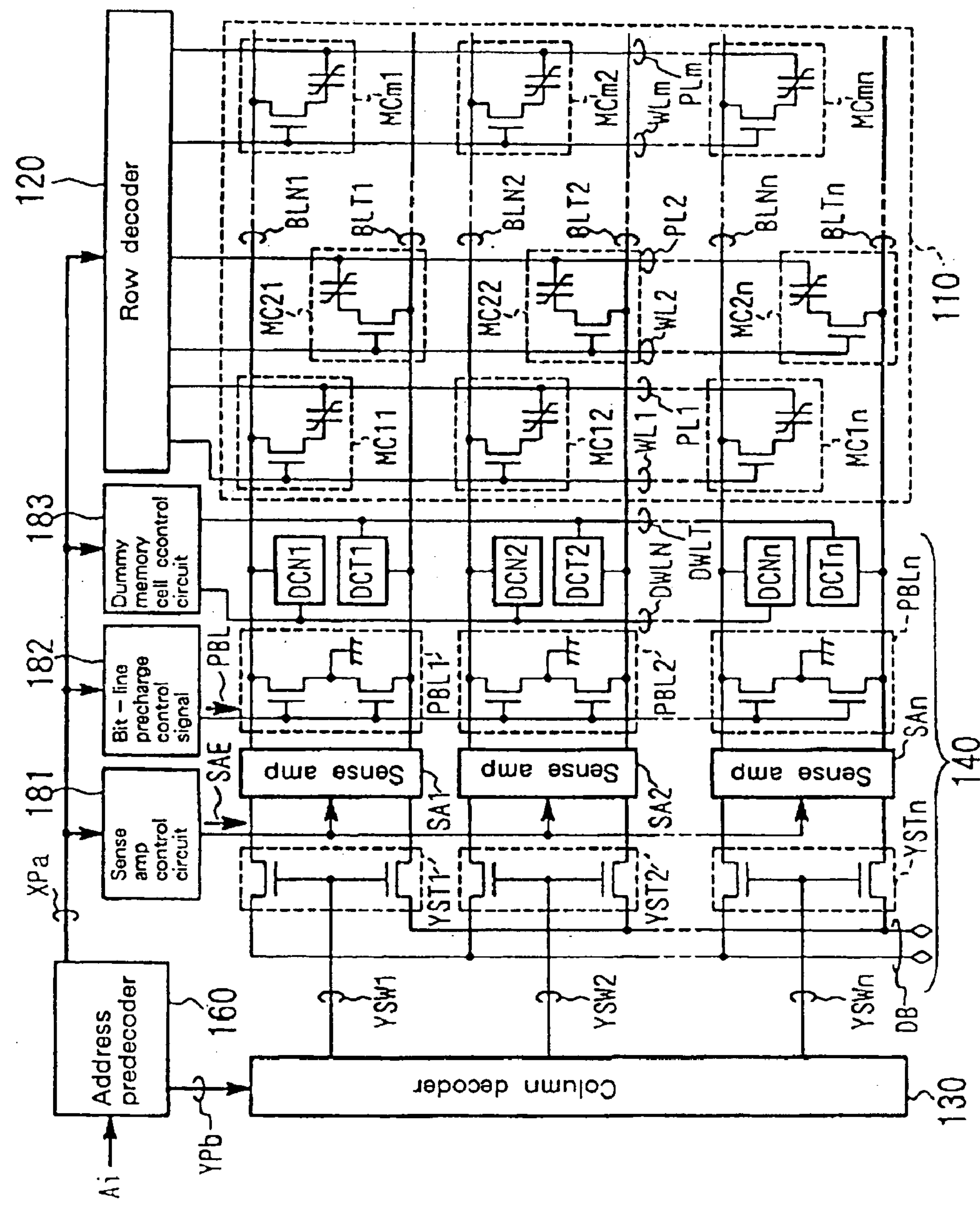
FIG. 1 is a circuit diagram illustrating an example arrangement of a conventional ferroelectric memory.

In each drawing, hereafter, same reference numeral denotes same element in FIG. 1, therefore description about such elements will be omitted if unnecessary.

As shown in FIG. 4, the reference potential setup circuit block 150 is arranged such that it is adjacent to a memory cell array 110 with m rows and n columns. The reference potential setup circuit block 150 sets up potential assigned from outside of the device as potential of reference signal that is to be a criteria when data signal occurring on a bit-line is amplified, and forms a support means for measuring potential of data signal read out from a memory cell to a bit-line in the memory cell array 110.

Associated to the memory cell 110 array are a row decoder 120, a column decoder 130, and a sense part circuit block 140. The sense part circuit block 140 includes sense amps SA1–SAn, bit-line precharge circuits PBL1–PBLn, and dummy memory cells DCN1, DCT1, -, DCNn, DCTn shown in FIG. 1 described above. A sense part circuit 180 includes a sense amp control circuit 181, a bit-line precharge control circuit 182, and a dummy memory cell control circuit 183 shown in FIG. 1.

An input/output buffer circuit 190 comprises a data input buffer circuit (not shown) for inputting data DIN (write data) from outside of the device and a data output buffer circuit (not shown) for outputting data DOUT (read-out data) to outside of the device, serving to transfer data between the semiconductor memory device 100 and the outside. A control circuit 170 receives various control signal CNTMEM that is input from out side of the device to control operation of the device inside, such as a address predecoder 160, the sense part control circuit 180 and the input/output buffer circuit 190.

The reference potential setup circuit block 150 characterizing the embodiment 1 will be described in detail.

The reference potential setup circuit block 150 sets up potential of reference signal occurring on bit-line BLNk or bit-line BLTk (reference potential), based on a control signal group CNTVBL for measurement of bit-line read-out potential, which is input from outside of the device in measurement of measurement of bit-line read-out potential.

Figure 5:
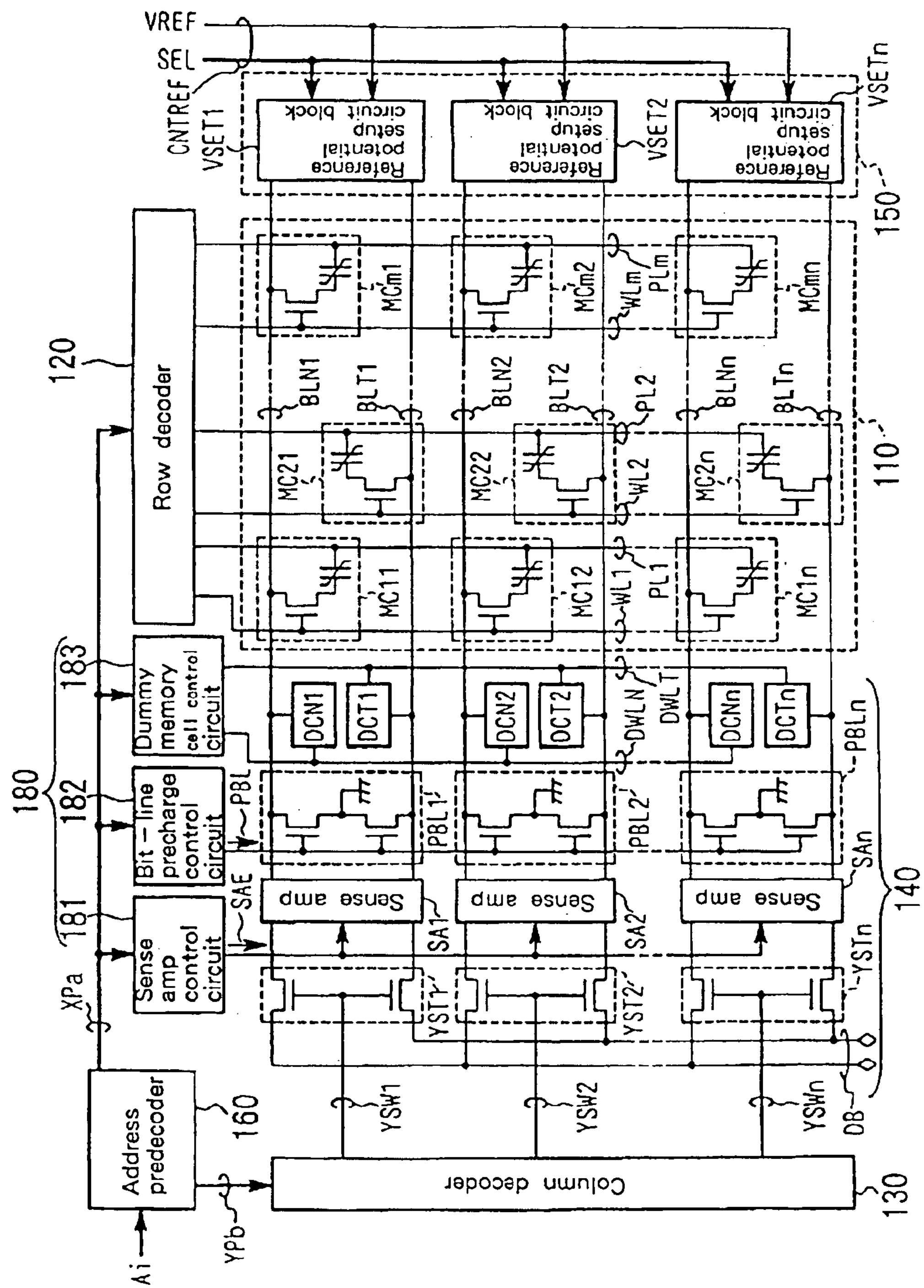
FIG. 5 is a circuit diagram schematically illustrating detailed arrangement of a ferroelectric memory according to embodiment 1 of the invention.

FIG. 5 shows connection relationship between each bit-line in the memory cell array and the reference potential setup circuit block 150. In FIG. 5, the reference potential setup circuit block 150 comprises reference potential setup circuits VSET1–VSETn, and the reference potential setup circuits are provided for each pair of bit-lines. Selection control signal SEL for selecting bit-line to set up reference potential, and potential VREF assigned from outside of the device are provided to reference potential setup circuits VSET1–VSETn, as the control signal group CNTVBL that is input from outside of the device. Selection control signal SEL and assigned reference potential VREF are, for example, applied from outside of the device through pad electrodes formed on the ferroelectric memory chip to the reference potential setup circuits. Unused pins of the package (NC-pin) may be also used.

In following description, potential assigned from outside of the device, VREF will be referred as "assigned reference potential VREF", and potential of reference signal occurring on bit-line will be referred as VBLREF.

Figure 6:
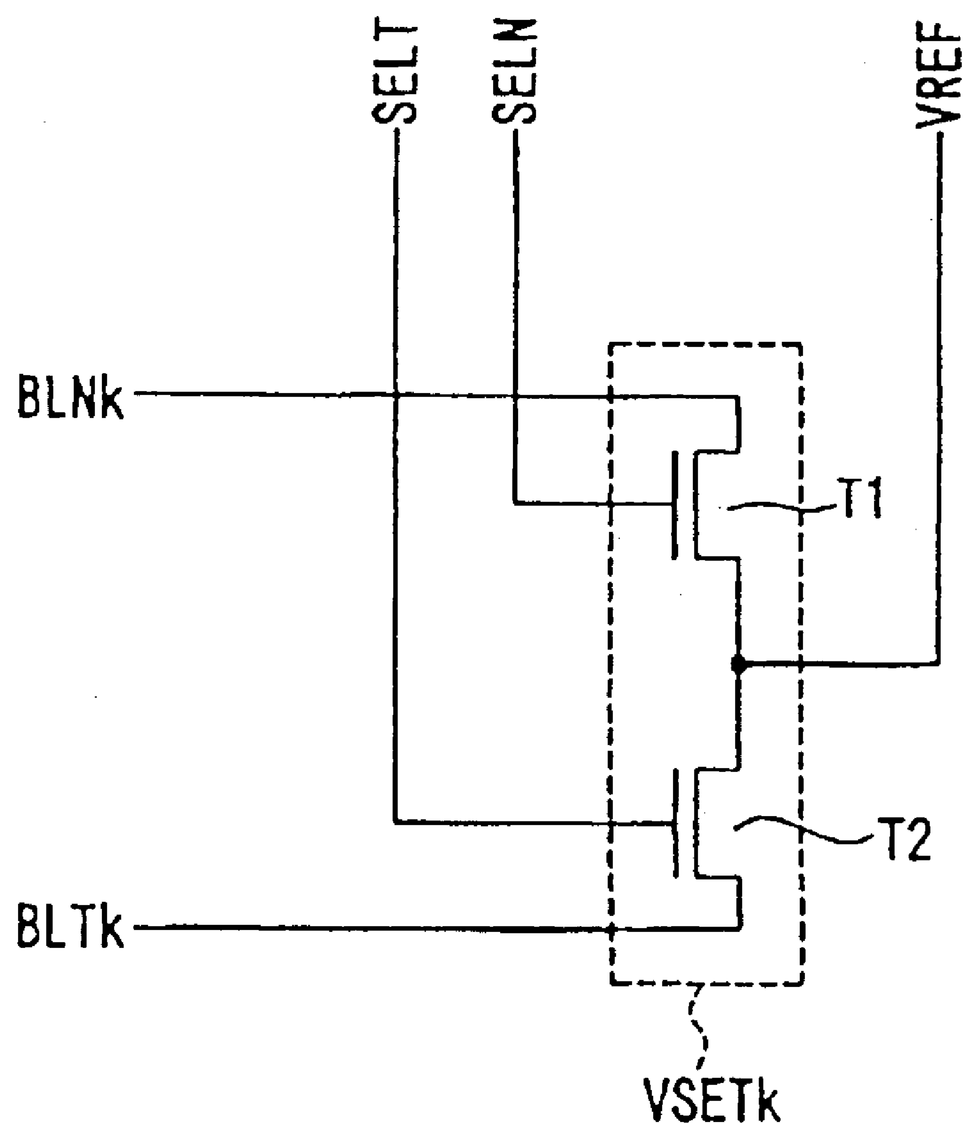
FIG. 6 is a circuit diagram illustrating an example arrangement of a reference potential setup circuit according to embodiment 1 of the invention.

FIG. 6 shows an example arrangement of the reference potential setup circuit VSETk.

As shown in the figure, the reference potential setup circuit VSETk comprises transistors T1, T2 wherein the drain terminals are connected to bit-lines BLNk, BLTk where reference signal occurs, and assigned reference potential VREF that is assigned from outside of the device is provided to the source terminals, and selection control signals SELNk, SELTk (selection control signal SEL) that are activated in measurement of bit-line potential (bit-line read-out potential) are respectively provided to respective gate terminal. In other words, one end of the current path of the transistor T1 is connected to the bit-line BLNk, and the selection control signal SELNk for selecting the bit-line BLNk is provided to its gate terminal. One end of the current path of the transistor T2 is connected to the bit-line BLTk, and the selection control signal SELTk for selecting the bit-line BLTk is provided to its gate terminal. Assigned reference potential VREF is provided to both of other ends of the transistors T1, T2. The transistors T1, T2 have a function as so-called transfer gate, and the source and drain are not necessarily specified in only one definition.

Figure 7:
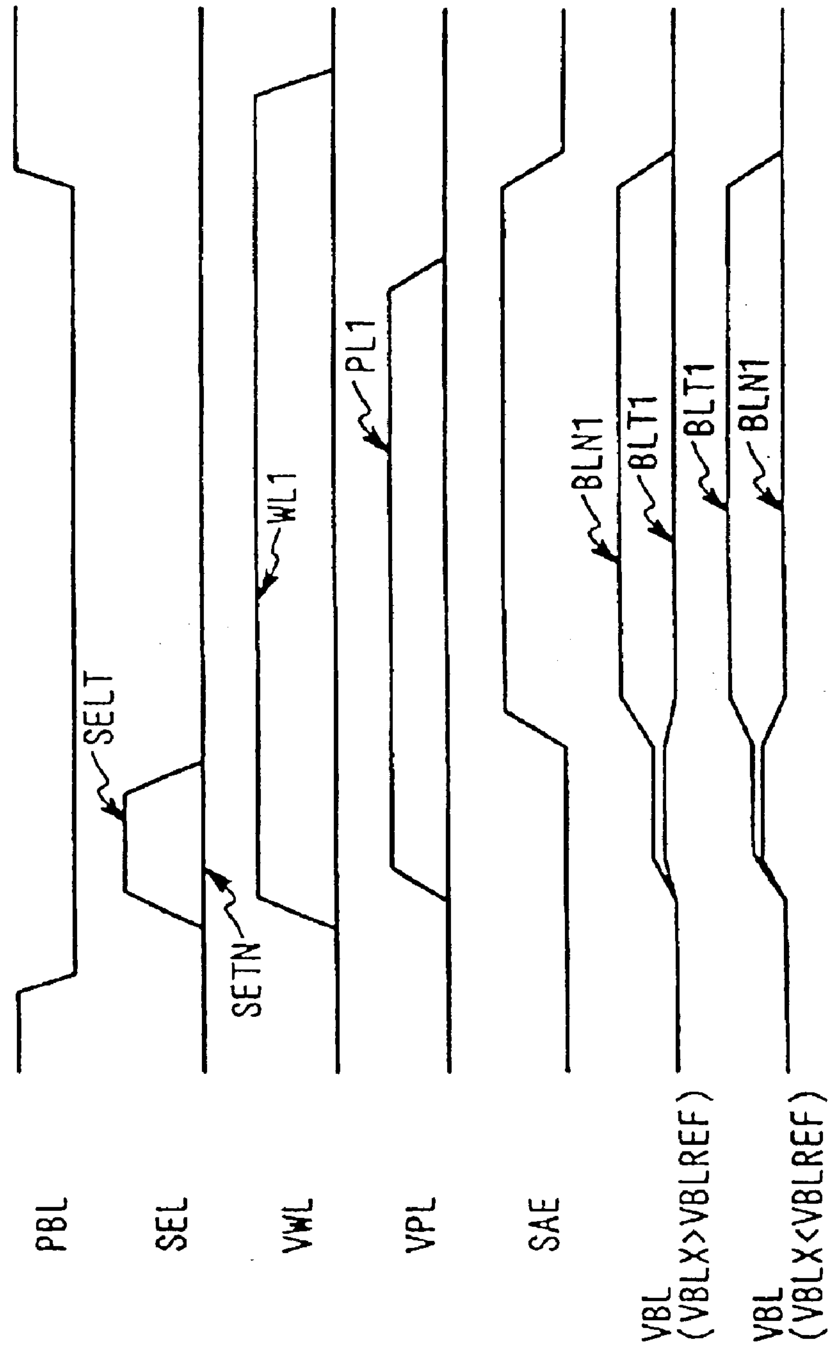
FIG. 7 is a timing chart for describing mechanism for measurement of bit-line read-out potential in a ferroelectric memory according to embodiment 1 of the invention.
Figure 8:
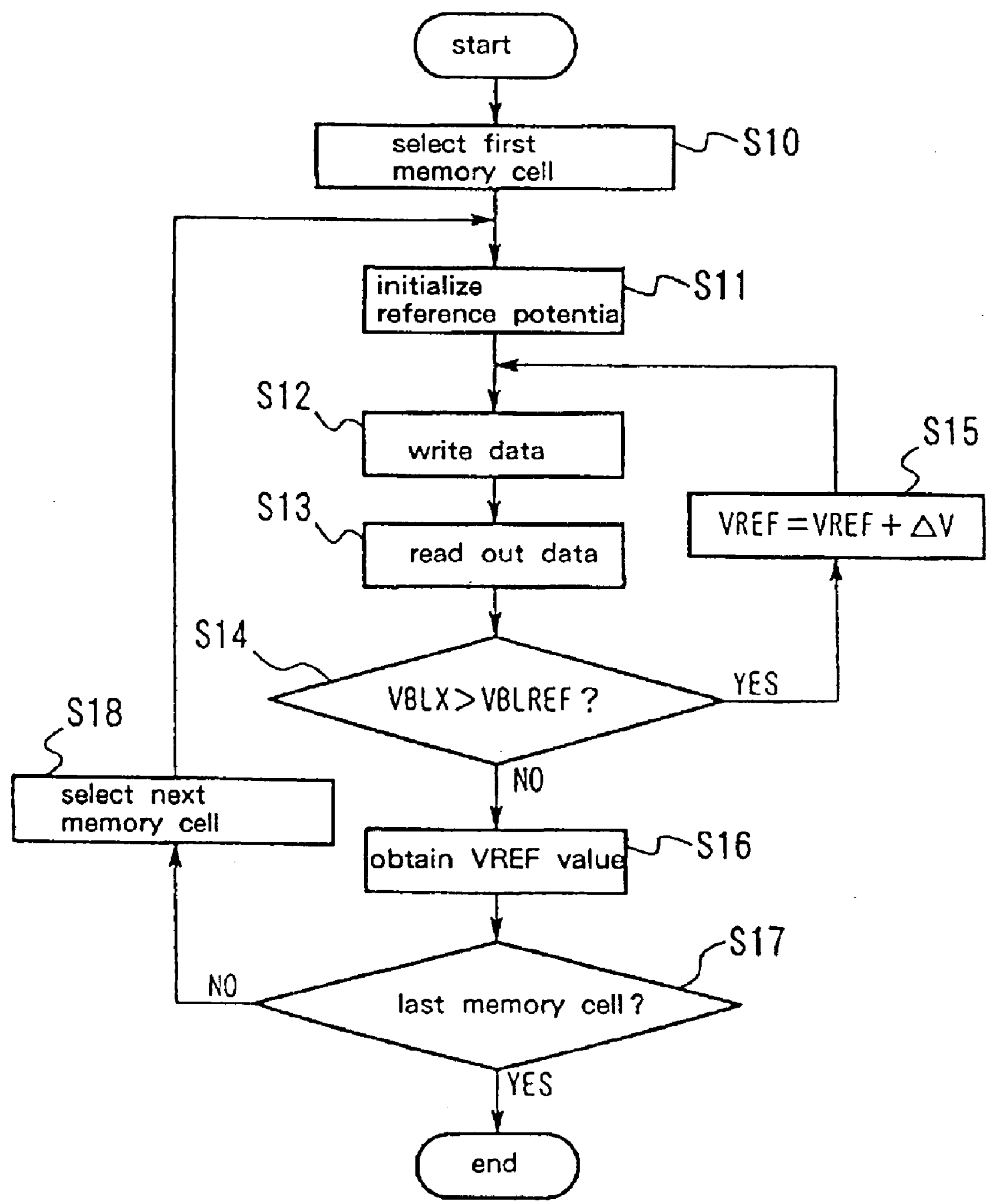
FIG. 8 is a flow chart illustrating a flow of operation of a ferroelectric memory according to embodiment 1 of the invention (measurement operation for bit-line read-out potential).

Operation of the ferroelectric memory 100 according to the embodiment 1 will be described along a flow chart in FIG. 8, in an example case of measurement of bit-line read-out potential, with reference to a timing chart shown in FIG. 7. FIG. 7 is timing chart of signal at each part in the case where bit-line read-out potential is measured in the circuitry shown in FIG. 5. FIG. 8 is a flow chart that shows operation flow for measurement of bit-line read-out potential. In the embodiment 1, bit-line read-out potential is measured for the entire memory cell that forms memory cell array 110 shown in FIG. 5.

Step S10: First, address signal Ai is set up by an external testing system (not shown) for the ferroelectric memory 100 to be tested, to select a first memory cell MC11.

Step S11: Next, potential VREF0 is set up as an initial value of the assigned reference potential VREF (for example, ground potential; 0V) by an external testing system. The assigned reference potential VREF0 is applied to the bit-lines BLT1–BLTn by reference potential setup circuits VSET1–VSETn shown FIG. 6. Specifically, when memory cells connected bit-lines BLN1–BLNn are selected, selection control signal SELT is made high-level, and the transistor T2 is turned on to apply the assigned reference potential VREF to the bit-lines BLT1–BLTn. As a result, reference potential VBLREF on bit-line BLT1 paring with bit-line BLN1 connected to the memory cell MC11 is set up to the assigned reference potential VREF0. The external testing system generates potential between the ground potential and source potential as assigned reference potential VREF with varying it in one direction, and provides it to the reference potential setup circuits VSET1–VSETn. As described later, the assigned reference potential VREF is incremented with increment of ΔV, but not limited to it and may be set to any voltage.

Step S12: Next, data DIN (write data) is set up by the external testing system for the input/output buffer circuit 190 and the data is written to the memory cell MC11. If the ferroelectric memory is binary memory, the write data is "0" or "1", and if it is ternary memory, the write data is one of "0", "1", and "2". The writing methods to the memory cell may be same as conventional ferroelectric memories.

Step S13: Next, data is read out from the memory cell MC11 that data have been written to, to the bit-line BLN1. The method for reading out data is same as conventional ferroelectric memories. As shown in FIG. 7, it is thus conducted after bit-line precharge signal PBL being made low-level by elevating word-line WL1 and plate-line PL1 connected to the memory cell MC11, respectively, to selection potential. Potential of data signal read out to the bit-line BLN1 is thus made bit-line read-out potential VBLX.

Step S14: Next, comparison is made for magnitude between reference potential VBLREF on the bit-line BLT1 and bit-line read-out potential VBLX on bit-line BLN1, with differential amplification at sense amp SA1.

Step S15: At this point, if the magnitude comparison result at step S14 is "bit-line read-out potential VBLX>reference potential VBLREF" (step S14: YES"), potential ΔV (>0) is added to the last reference potential VBLREF to increment VBLREF, and repeat the above step S12–S15. The potential ΔV is a change amount of assigned reference potential VRFE that provides reference potential VBREF on bit-line, and is determined by considering sensitivity of the sense amps, measurement precision, and the others.

Step S16: If bit-line read-out potential VBLX is between the ground-potential and the source potential, by repeating steps S12–S15 above mentioned a relationship is finally achieved "bit-line read-out potential VBLX<reference potential VBLREF" since value of the reference potential VBLREF is increased gradually from the ground potential to the source potential. In the process to increase the reference potential BVLREF, when the relationship "bit-line read-out potential VBLX <reference potential VBLREF" is first achieved (step S14: NO), the value of reference potential VBLREF at this point is taken. In this case, since the reference potential VREF is set up to assigned reference potential VREF, what is directly taken is the assigned reference potential VREF. The value of the assigned reference potential VREF at this point is taken as the measurement of bit-line read-out potential VBLX at the point.

Step S17: Next, determination is made whether the memory cell selected at this point is the last cell or not. Since it is now in the status that the first memory cell MC11 is selected, NO-determined is made that the memory cell is not the last memory cell.

Step S18: On the NO-determination at the step S17 (step S17: NO), next memory cell M21 is selected, and the process of the above steps S11–S16 is also executed for the memory cell MC21 as well.

After that, a series loop process of above steps S11–S18 is repeated until YES-determination is made at step S17 that it is the last memory cell, thereby conducting measurement of bit-line read-out potential VBLX for all memory cells.

In the measurement operation described so far, since the read-out operation involves destruction of stored data at memory cells, rewrite operation may be performed as in ferroelectric memories related to the conventional art described above, if it is needed to hold stored data. If it is not needed to retain stored data, rewriting operation may be omitted.

Next, measurement mechanism for bit-line read-out potential VBLX will be described in detail in an example of memory cell MC11, with reference to a timing chart in FIG. 7.

Bit-line read-out potential VBLX on bit-line BLN1 connected to memory cell MC11 is compared with reference potential VBLREF on bit-line BLT1, and amplification operation is performed by sense amp SA1, depending on magnitude relationship between these potentials. The magnitude relationship is ideally inverted at states where reference potential VBREF is equal to bit-line read-out potential. In the embodiment 1, bit-line read-out potential VBLX is measured utilizing the phenomenon, in that the bit-line read-out potential VBLX is indirectly obtained by externally, intentionally controlling reference potential VBLREF and observing reference potential VBLREF at the time when the magnitude relationship of the potentials is inverted.

It will be described specifically below. Reference potential VBLREF on bit-line is set up externally, intentionally by reference potential setup circuit VSETk shown in FIG. 6. Specifically, in FIG. 6, if a memory cell connected to bit-line BLNk is selected, transistor T2 is turned on by making selection control signal SELT high-level, and assigned reference potential VREF is applied to bit-line BLTk. As a result, reference potential VBLREF on bit-line BLTk is set to assigned reference potential VREF, and the bit-line BLTk is set to intended potential. On the other hand, if a memory cell connected to bit-line BLTk is selected, transistor T1 is turned on by making selection control signal SELN high-level, and the bit-line BLTk is set to intended potential.

Magnitude relationship between the bit-line read-out potential VBLX and reference potential VBREF is obtained from the result of differential amplification with the sense amp, as follows. In the case of "bit-line read-out potential VBLX>reference potential VBLREF", after sense amp activation signal SAE is made high-level and the amplification operation is completed, potential of bit-line BLT1 is made low-level and potential of bit-line BLN1 is made high-level, as shown in the sixth waveform from the top in FIG. 7 (bit-line potential VBL). After that, once column selection line YSW1 is driven to perform normal read-out operation, a logic value is output as logic value of data DOUT, depending on the magnitude relationship between the bit-line potentials in this case (BLT1/BLN1=low-level/high-level).

Next, in the case of "bit-line read-out potential VBLX<reference potential VBLREF", after sense amp activation signal SAE is raised and the amplification operation is completed, potential of bit-line BLT1 is made high-level and potential of bit-line BLN1 is made low-level, as shown in the seventh waveform from the top in FIG. 7. After that, once column selection line YSW1 is driven to perform normal read-out operation, a logic value is output as logic value of data DOUT, depending on the magnitude relationship between the bit-line potentials in this case (BLT1/BLN1=high-level/low-level).

As explained above, "differential operation with sense amp" means that comparison is made between potentials of bit-line BLNk and BLTk to make the higher potential high-level and the lower potential low-level. Magnitude relationship between bit-line read-out potential VBLX and reference potential VBLREF is thus obtained from logic value of data DOUT read out externally as the differential amplification operation.

Magnitude relationship between bit-line read-out potential VBLX and reference potential VBLREF is inverted at critical point where the potentials is equal to each other. In other words, the reference potential at the time when the magnitude relationship between the potentials is inverted during reference potential VBLREF being intentionally, externally controlled, is obtained as the bit-line read-out potential. Therefore, the value of bit-line read-out potential VBLX is indirectly obtained by monitoring assigned reference potential VREF that is assigned as reference potential VBLREF externally by a testing system, and logic value of data DOUT read out from the ferroelectric memory to be tested, and by obtaining the assigned reference potential VREF at the time when value of data DOUT is inverted.

In the example described above, since the initial value of reference potential VBLREF is the ground potential and reference potential VBREF is gradually incremented with increment unit of potential ΔV (>0), the status changes from the first state of magnitude relationship "bit-line read-out potential VBLX>reference potential VBLREF" to a states of magnitude relationship "bit-line read-out potential VBLX<reference potential VBLREF". The opposite method may be used where the initial value of reference potential VBLREF is the power source potential and reference potential VBLREF is gradually decremented. In this case, the status changes from the first state of magnitude relationship "bit-line read-out potential VBLX<reference potential VBLREF" to a states of magnitude relationship "bit-line read-out potential VBLX>reference potential VBLREF".

In the description so far, the relationship of "bit-line read-out potential VBLX=reference potential VBLREF" has been out of consideration. The reason is that the relationship cannot be observed from result of the amplification operation of the sense sells. Specifically, even if in actual operation of the ferroelectric memory the relationship of "bit-line read-out potential VBLX=reference potential VBLREF" is achieved, the sense amp determines the state of "bit-line read-out potential "BLN2/reference potential BLT2" to be one of "low-level/high-level" and "high-level/low-level" and perform amplification operation to output one of data "0" and "1", because offset exists in the sense amp. Therefore, it is impossible to observe the relationship of "bit-line read-out potential VBLX=reference potential VBLREF" from data DOUT that is result of the differential amplification.

Additionally, since amplification operation of the sense amp is based on an assumption that there is potential difference between bit-line read out potential and reference potential, the relationship of "bit-line read-out potential VBLX=reference potential VBLREF" cannot be directly detected. However, if the potential ΔV is set up finely, which is change amount of reference potential, the reference potential VBLREF that achieves "bit-line read-out potential VBLX=reference potential VBLREF" can be obtained practically. Therefore, potential ΔV is suitably set up by considering offset of the sense amps and required measurement precision.

The description so far is an example of the method for measuring bit-line read-out potential VBLX in the ferroelectric memory according to the embodiment 1. The reference potential setup circuits VSETk shown in FIG. 6, if there is another circuit serving to apply assigned reference potential VREF to bit-lines BLNk, BLTk, may be shared with the circuit.

Next, A testing system having a function to measure bit-line read-out potential in the ferroelectric memory 100 will be described.

Figure 9:
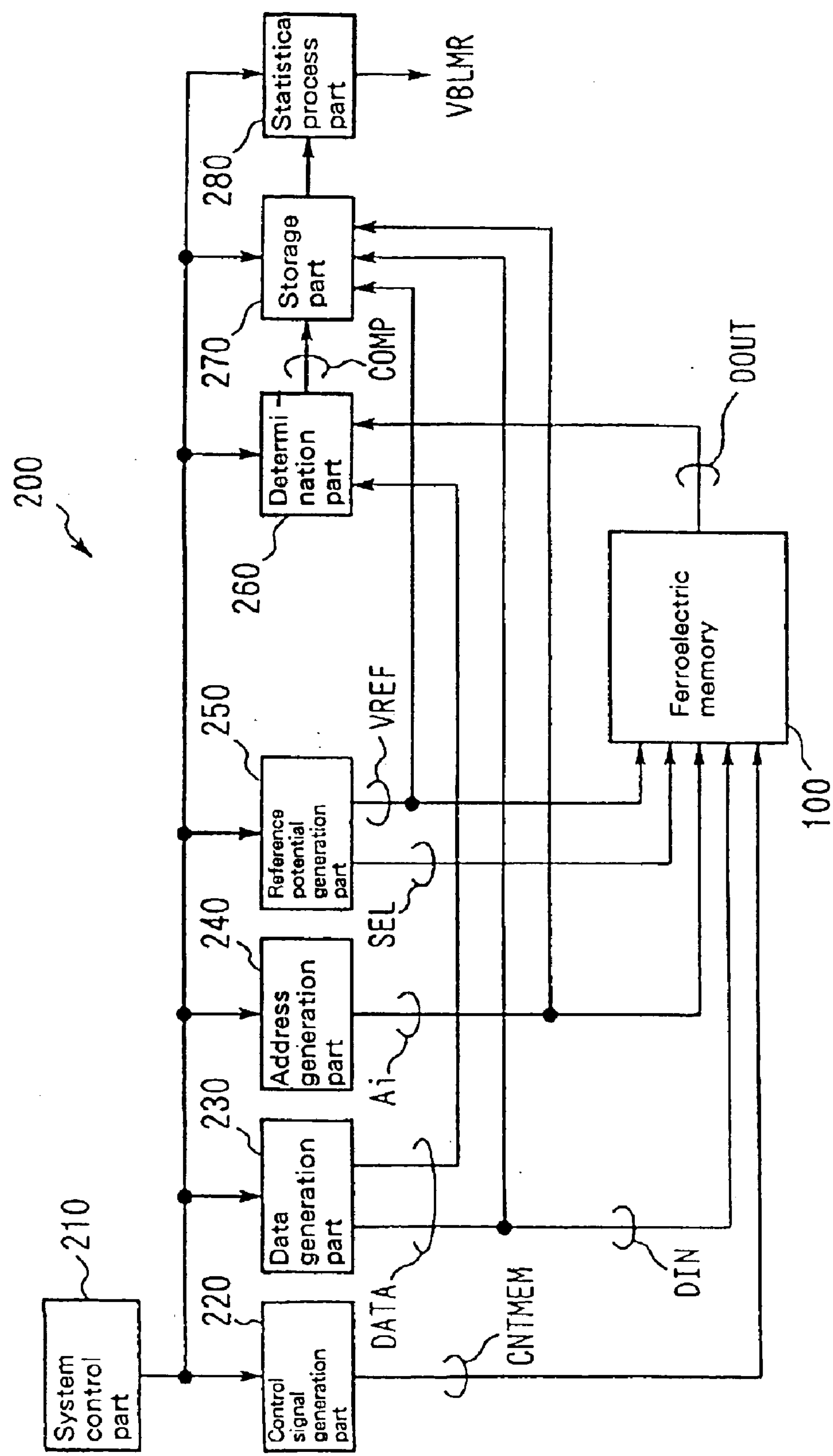
FIG. 9 is a block diagram illustrating an example arrangement of a testing system according to embodiment 1 of the invention.

FIG. 9 shows an example of an arrangement of a testing system 200. Bit-line read-out potential can be measured without using general purpose testing system such as a memory tester by using the testing system 200. In FIG. 9, a system control part 210 manages and controls operation of the entire system. A control signal generation part 220 generates control signal CNTMEM described above for controlling read-out and write operation of the ferroelectric memory 100 to be tested.

A data generation part 230 generates data DIN as well as write data DIN described above as expectation value data. An address generation part 240 generates addresses. The control signal generation part 220, data generation part 230 and address generation part 240 form a control part for controlling a series of operation steps of generating address to provide the ferroelectric memory 100 and reading out data signal from the memory cell.

A reference potential generation part 250 generates assigned reference potential VREF between the power source potential with varying if in one direction, and ground potential to provide the reference potential setup circuit block 150, and generates the assigned reference potential VREF as well as selection control signal SEL above described. A determination part 260 determines logic value of data signal amplified by sense amps SA1–SAn, specifically determines logic value of data DOUT that is output from the ferroelectric memory 100 to the outside, and outputs flag signal COMP representing the determination result. A storage part 270 stores value of reference potential VBLREF at the times when logic value of the data DOUT is inverted (assigned reference potential VREF), with reference to the flag signal COMP. A statistical process block 280 processes the value of the reference potential stored in the storage part 270 and outputs statistical process result VBLMR.

Operation of the testing system 200 will be simply described.

The control signal generation part 220, data generation 230, address generation 240 and reference potential generation part 250 generate under control of the system control part 210 each of signals such as the control signal CNTMEM, write data DIN, address signal Ai, assigned reference potential VREF and selection control signal SEL to apply it to the ferroelectric memory 100. On the other hand, the determination part 260 determines logic value of data output DOUT that is output form the ferroelectric memory 100 and outputs flag signal COMP representing the determination result to the storage part 270. The flag signal COMP shows that logic value of data DOUT inverts.

With reference to the flag signal COMP, determination process at step S14 shown in FIG. 8 described above is performed. For example, if logic value of flag signal COMP is “0”, it is determined that magnitude relationship of “VBLX>VBLREF” is achieved, and if logic value of flag signal COMP is “1”, it is determined that magnitude relationship of “VBLX<VBLREF” is achieved. The assigned reference potential VREF at the time when the magnitude relationship of “VBLX<VBLREF” is first achieved is extracted, and is stored in the storage part 270 as information representing the bit-line read-out potential VBLX at this point. In the same time, address Ai of the memory cell, for which bit-line read-out potential is measured, and write data DIN are also stored in the storage part 270 as appended information corresponding to the assigned reference potential VREF.

If the storage part 270 can only store digital values, the extracted assigned reference potential VREF is stored in the storage part 270 after it is suitably A/D converted. The information stored in the storage part 270 (that is, bit-line read-out potential VBLX of the memory cell specified by the address Ai and the others) is statistically processed by the statistical process part 280, and is kept as database of measurement result of bit-line read-out potential.

In the ferroelectric memory 100 shown in FIG. 5 described above, only the reference potential setup circuit block 150 for setting up assigned reference potential VREF for bit-line is integrated onto the chip. In addition to the reference potential setup circuit block 150, functions implemented by the system control part 210, control signal generation part 220, data generation part 230, address generation part 240, reference potential generation part 250, determination part 260, storage part 270 and statistical process part 280, and all or a part of the various wiring may be integrated on the ferroelectric memory 100.

According to the embodiment 1 above described, bit-line read-out potential can be measured in short time without generating large capacitive load or current load on the bit-line for the bit-line read-out potential measurement, and without leaving for long time the status of data read-out on the bit-line.

The description for the embodiment 1 has been completed.

Embodiment 2

Embodiment 2 of the invention will be described hereafter.

Figure 10:
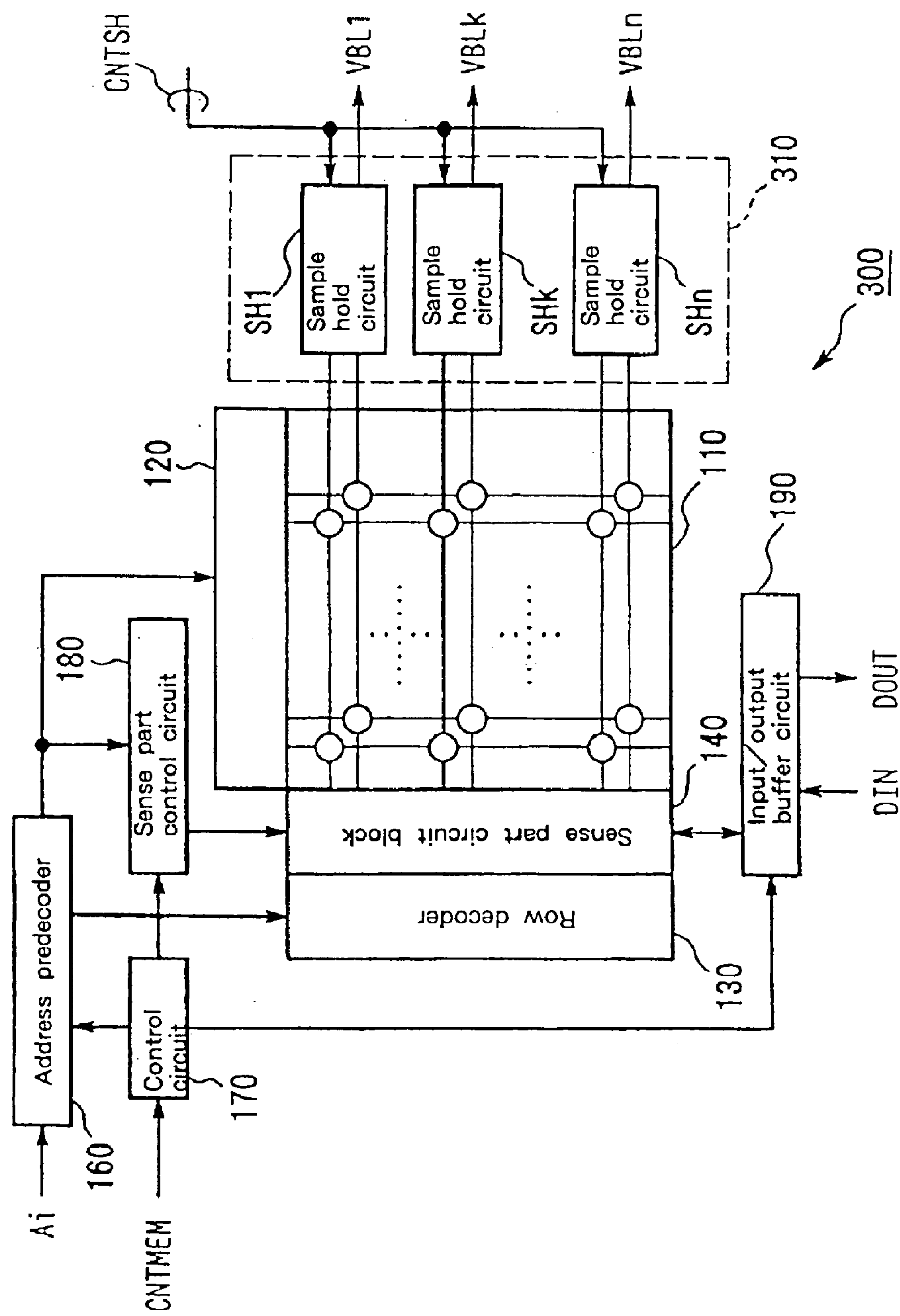
FIG. 10 is a block diagram schematically illustrating the entire arrangement of a ferroelectric memory according to embodiment 2 of the invention.

FIG. 10 shows an arrangement of a ferroelectric memory 300 according to the embodiment 2. The ferroelectric memory 300 is formed by comprising a signal hold circuit block 310 for taking and holding data signal read out to bit-line BLNk, BLTk based on control signal CNTSH, in the arrangement of the embodiment 1 shown FIG. 4, instead of the reference potential setup circuit block 150. The signal hold circuit block 310 comprises a plurality of sample hold circuits provided for each two-bit-line pair.

Figure 11:
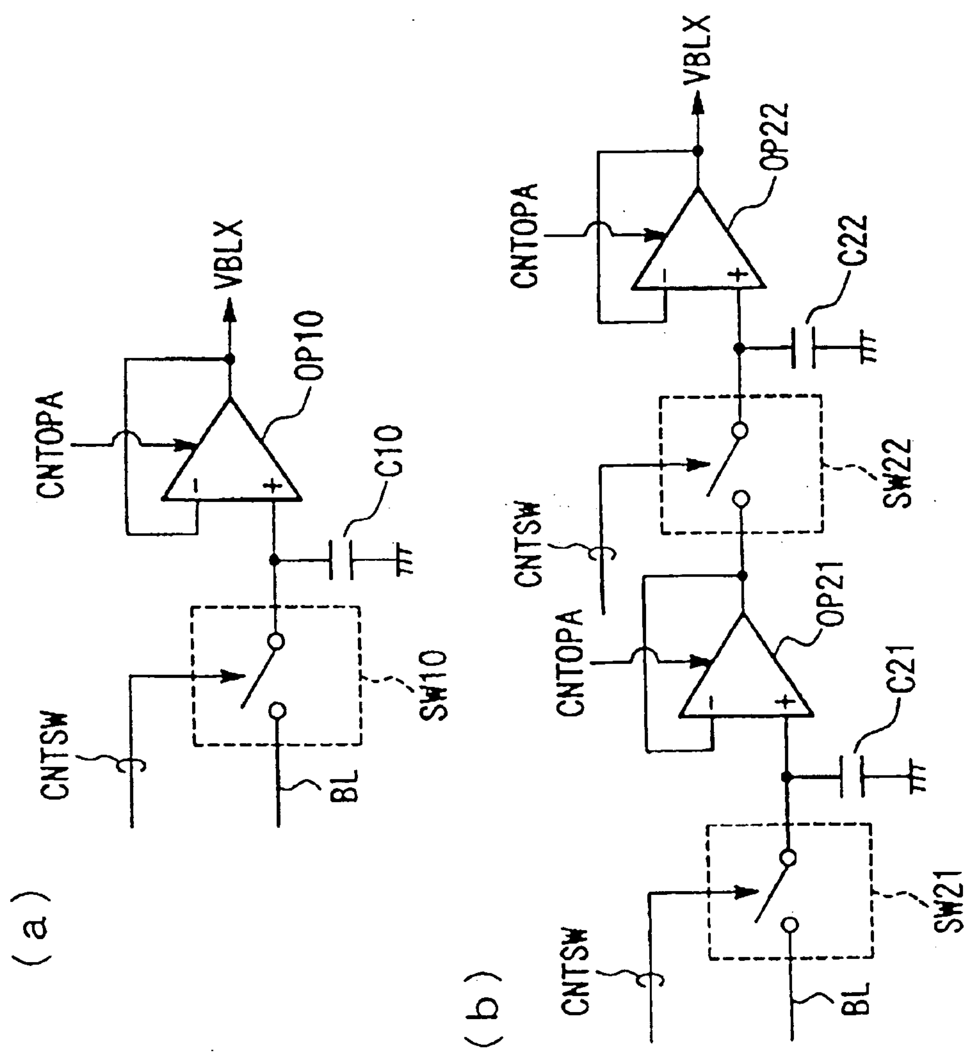
FIGS. 11(*a*) and (*b*) show circuit diagrams illustrating example arrangements of a sample hold circuit according to embodiment 2 of the invention (where the circuit is provided for one bit-line).

FIG. 11 shows examples of arrangement of the sample hold circuit. An example arrangement shown in FIG. 11(*a*) comprises a analog switch connected bit-line (BLNk or BLTk), which opens or closes depending on control signal CNTSW, a sample capacitor C10 for storing bit-line read-out potential and a voltage follower mainly consisting of operational amplifier OP10. One terminal of the switch SW10 is connected to the bit-line BL (BLNk, BLTk) and another terminal is connected to input portion of the voltage follower comprising operational amplifier OP10. The sample capacitor C10 is connected between the input portion of the voltage follower and the ground. Activated state of the operational amplifier OP10 (operate/wait) is controlled with control signal CNTOPA. Control signal CNTSW and control signal CNTOPA is provided as the control signal CNTSH above described.

In the case where the sample hold circuit shown in FIG. 11(*a*) is operated, first the switch SW10 is turned on by control signal CNTSW to store bit-line read-out potential on the bit-line in C10. Next, the switch SW10 is turned off and the operational amplifier OP10 is activated by control signal CNTOPA so as to output analog bit-line read-out potential VBLX from the operational amplifier OP10 (voltage follower) to the outside. Timing of the switch SW10 open/close and timing of the operational amplifier OP10 may be shifted to each other. Output signal of the operational amplifier OP10 is taken externally via pad electrodes formed on the chip or unused terminals of the package.

In this sample hold circuit, it is important to lower capacitance of the sample capacitor C10 substantially lower than parasitic capacitance of the bit-line BL (for example, less than 10% of parasitic capacitance of the bit-line). By that, influence of input capacitance of the sample hold circuit on bit-line read-out potential can be reduced, thereby improving measurement precision.

There might be problems due to limiting the sample capacitor C10 low that leak from the sample capacitor itself become apparent so that it become impossible to hold bit-line read-out potential in the sample hold circuit for substantial time period, and that current drive capacity of the voltage follower (the operational amplifier OP10) become insufficient. An example for arrangement of a sample hold circuit to solve such problems is shown in FIG. 11(*b*).

The sample hold circuit shown in FIG. 11(*b*) is basically a circuit formed by converting the sample hold circuit in FIG. 11(*a*) to a circuit with two-stage arrangement. The first stage thus comprises an analog switch SW21, a sample capacitor C21, and a voltage follower consisting of an operational amplifier OP21. The second stage comprises an analog switch SW22, a sample capacitor C22, and a voltage follower consisting of an operational amplifier OP22. Arrangement of each sample hold circuit in the first and second stages is same as the one shown in FIG. 11(*a*).

However, the sample hold circuit in the first stage is formed as the circuit in FIG. 11(*a*) described above, and the sample capacitor C21 has low capacitance. The sample capacitor C22 in the sample hold of the second stage has large capacitance, and the operational amplifier OP22 also has large current drive capability. By that, it can comprise a large-capacitance sample capacitor needed for holding potential bit-line read-out potential and an operational amplifier with large current drive capability, while limiting capacitive load of signal hold circuit block 310 directly seeable from the bit-lines.

In the case of 1T/1C type operation in the arrangement shown in the FIG. 5, the bet-line, from which data from selected memory cell is read out, is only one of pairing bit-lines BLNk, BLTk. Therefore, the number of the operational amplifiers forming the sample hold circuit can be reduced when the analog switch in the sample hold circuit is also used as a switch for switching the bit-lines. An example arrangement of such sample hold circuit is shown in FIG. 12.

Figure 12:
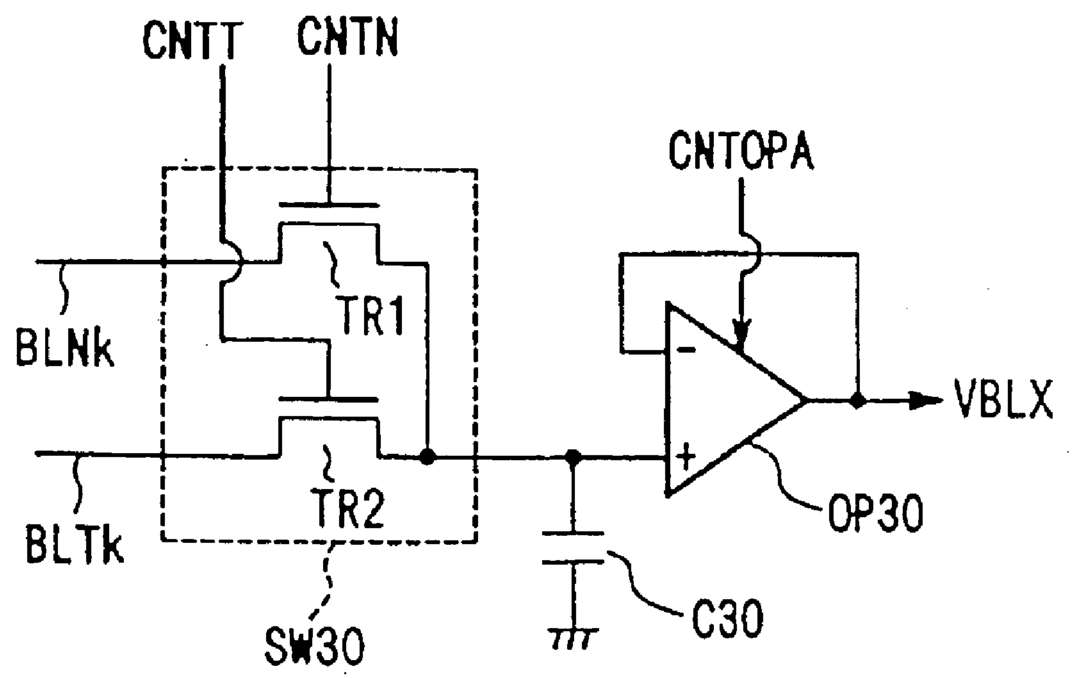
FIG. 12 is a circuit diagram illustrating an example arrangement of a sample hold circuit according to embodiment 2 of the invention (where the circuit is provided for each pair of bit-lines).

In FIG. 12, bit-line BLNk is connected to one end of the current path of transistor TR1 as an analog switch, and bit-line BLTk is connected to one end of the current path of transistor TR2 as an analog switch as well. Other ends of the current paths of the transistors TR1, TR2 are together connected to input of a voltage follower consisting of an operational amplifier OP3. A sample capacitor C30 is connected between the input and the ground. Control signals CNTN and CNTT are respectively provided to the transistors TR1 and TR2, and the transistors are controlled to turn on complementarily. In operational amplifier OP30, the activation state (operate/wait) is controlled by control signal CNTOPA.

Figure 13:
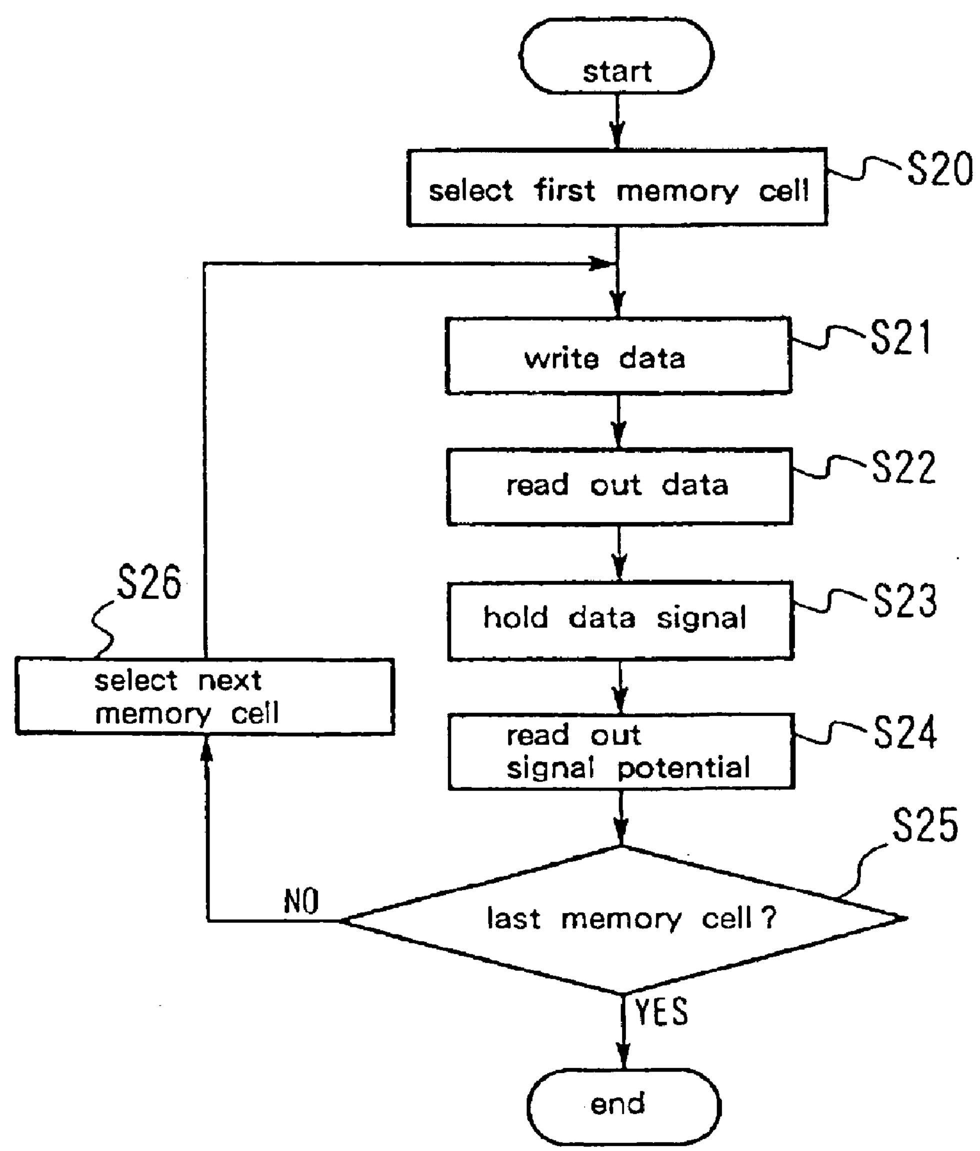
FIG. 13 is a flow chart illustrating a flow of operation of a ferroelectric memory according to embodiment 2 of the invention (measurement operation for bit-line read out potential).

Operation in embodiment 2 will be described hereafter, along a flow chart in FIG. 13, for an example where bit-line read-out potential of ferroelectric memory cell 300 shown in FIG. 10 is measured. FIG. 11(*a*) shows an arrangement of each sample hold circuit forming signal hold circuit block 310.

Step S20: First, address is applied to the ferroelectric memory cell 300 to be tested, by an external testing system (not shown) so as to select a first memory cell.

Step S21: Next, write data is applied from the external testing system and written to the memory cell. If the ferroelectric memory cell is binary memory, the write data is "0" or "1", and if it is ternary memory, the write data is "0", "1" or "2". The method for writing the memory cell may be same as a method for conventional ferroelectric memory cells.

Step S22: Next, data is read out from the memory cell, to which data is written, to bit-line (BLNk or BLTk). The method for reading out data is similar to one for conventional memory cells. Potential of the data signal thus read out the bit-line is bit-line read-out potential VBLX.

Step S23: Next, the bit-line read-out potential VBLX is held. Specifically, switch SW10 is turned on by control signal CNTSW, and the bit-line read-out potential VBLX is held in sample capacitor C10 in the sample hold circuit. Operational amplifier OP10 is controlled by control signal CNTOPA and outputs analog potential corresponding to the bit-line read-out potential VBLX held in sample capacitor C10. The output of the sample hold circuit will be referred as "bit-line read-out potential VBLX (SH)".

Step S24: Next, bit-line read-out potential VBLX (SH) is transferred to an A/D converter or the like in the external testing system to be A/D converted, giving digital bit-line read-out potential. The bit-line read-out potential converted to digital value will be referred as "bit-line read-out potential VBLX (D)".

Step S25: Next, determination is made whether the memory cell selected at this point is the last cell or not. At this point, the status is such that the first memory cell is selected, NO-determination is made that it is not the last cell.

Step S26: If NO-determination is made at step S25 described above (step S25: NO), a memory cell is then selected and process of steps S21–S24 described above is executed to the memory cell.

After that, a series of loop processes of steps S21–S26 is repeatedly executed to each memory cell until YES-determination is made that the memory cell in this point is the last memory cell, so as to obtain bit-line read-out potential VBLX(D) for all memory cells.

The example method for measuring bit-line read-out potential for ferroelectric memory cell 300 shown in FIG. 10 has been described.

Next, a testing system having a function for measuring bit-line read-out potential for ferroelectric memory cell 300 describe above will be described.

Figure 14:
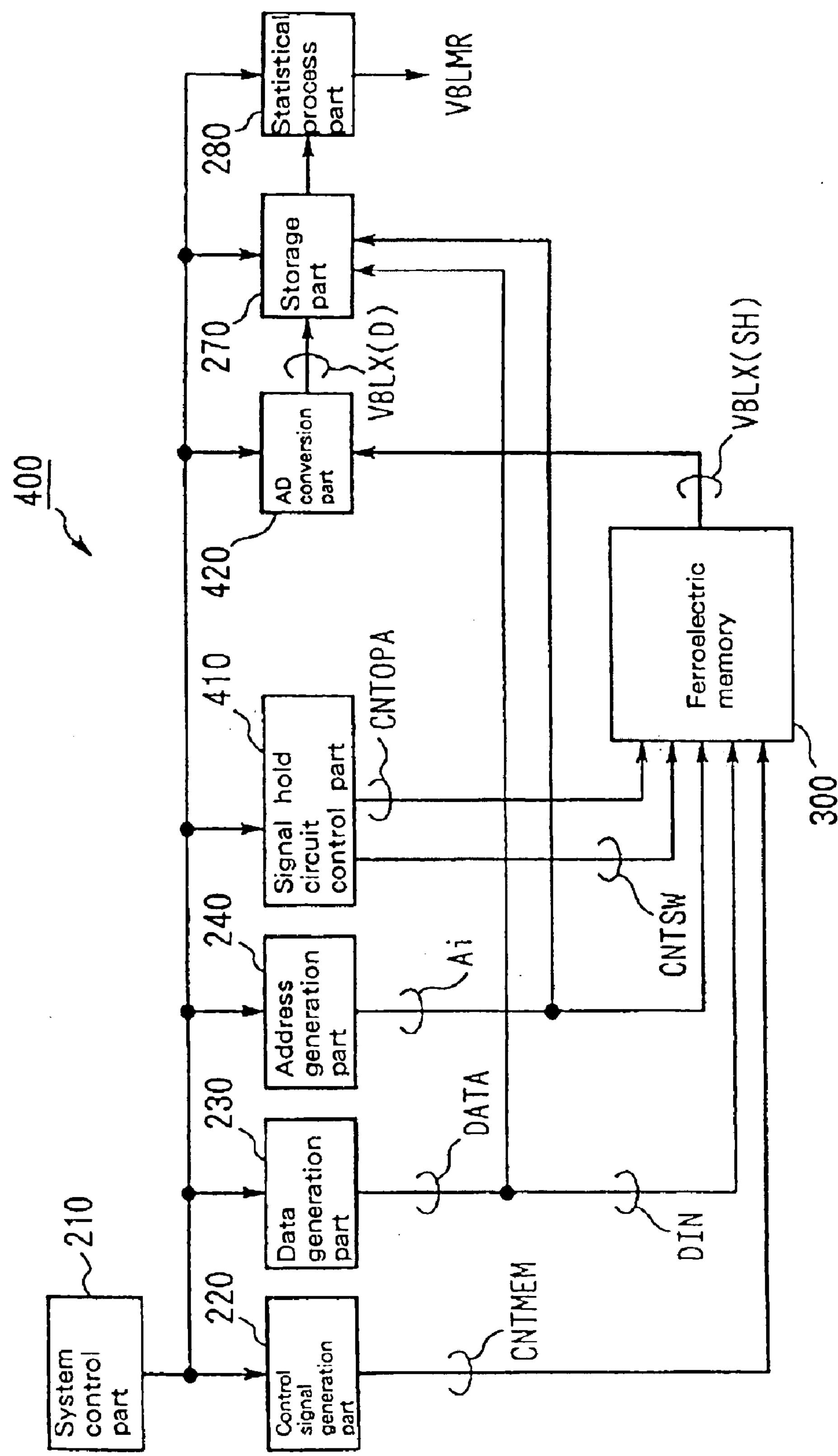
FIG. 14 is a block diagram illustrating a testing system according to embodiment 2 of the invention.

FIG. 14 shows an example of arrangement of the testing system 400.

Bit-line read-out potential can be measured without using a general purpose testing system, by using the testing system 400. The elements in the testing system 400 that are different from ones in the arrangement in FIG. 9 will be only described since the system is substantially has same arrangement as testing system 200 in FIG. 9 according to embodiment 1 described above.

In FIG. 14, ferroelectric memory 300 is the semiconductor to be tested by testing system 400. The ferroelectric memory 300 is provided with signal hold circuit block 310 as described above and outputs analog bit-line read-out potential VBLX(SH). Testing system 400 comprises a signal hold circuit control part 410 and an A/D conversion part 420 instead of reference potential generation part 250 and determination part 260 in the arrangement of FIG. 9.

A signal hold circuit control part 410 is used for taking data signal read out to bit-line into signal hold circuit block 310 in ferroelectric memory 300, and generates control signal CNTSW, CNTOPA described above. A/D conversion part 420 AD-converts bit-line read-out potential VBLX (SH) that is output from signal hold circuit block 310 to outside, so as to output digital bit-line read-out potential VBLX(D).

Operation of the testing system 400 will be simply described.

Control signal generation part 220, data generation part 230, address generation part 240 and signal hold circuit control part 410 generate under control of system control part 210 each signal of control signal CNTMEM, write data DIN, address Ai and control signal CNTSW, CNTOPA and the others described above, so as to apply them to ferroelectric memory 300. AD conversion part 420 AD converts bit-line read-out potential VBLX(SH) read out from ferroelectric memory 300 to output digital bit-line read-out potential VBLX(D) to storage part 270.

At this point, address Ai of the memory cell, for which measurement of bit-line read-out potential, and write data DIN are stored in storage part 270 as appended information corresponding to bit-line read-out potential VBLX(D). Statistical process part 280 processes statistically information stored storage part 270 (or such as bit-line read-out potential VBLX(D) for data signal of memory cell specified by address Ai) to keep it as database of the measurement result of bit-line read-out potential.

In memory cell 300 shown in FIG. 10, only signal hold circuit block 310 for holding bit-line read-out potential VBLX is integrated on the chip. The integration is, however, not limited to the case, but in addition to the signal hold circuit block 310, functions implemented by system control part 210 forming testing system 400, control signal generation part 220, data generation part 230, address generation part 240, signal hold circuit control part 410, AD conversion part 420, storage part 270 and statistical process part 280 described above, as well as all or a part of various wiring may be integrated on ferroelectric memory 300.

Embodiment 2 have been thus described.

While data retention performance of the memory cell have been not taken in consideration for read-out of the data written to the memory cell in the description for embodiment 1, additional simple measurement steps provide measurement of the data retention performance. For example, in flow chart shown in FIG. 8, according to embodiment 1, if a step of waiting for a certain time Tret is provided between step 11 and step S12, bit-line read-out potential after data retention time Tret can be measured. Therefore, the memory cell data retention performance is derived from the bit-line read-out potential after data retention time Tret. Likewise, in flow chart shown in FIG. 13, according to embodiment 2, if a step of waiting for a certain time Tret is provided between step S21 and step S22, bit-line read-out potential after data retention time Tret can be measured.

Resistance for repeated operation can be measured if measurement of bit-line read-out potential is performed after repeating write operation or readout operation, for example $10^n$ times. The invention can be thus applied to reliability test for semiconductor devices such as data retention performance or resistance for repeated operation, helping improvement of reliability of the semiconductor memory devices.

Additionally, in embodiment 1 and 2 described above, measurement of read-out potential can be performed by similar procedure to normal memory operation. Specifically, as it is understood from flow charts FIG. 8 and FIG. 13, it needs only to apply electrical input signal to a ferroelectric memory cell to be tested and monitor the output signal, and the measurement of bit-line read-out potential can be performed only by using an existing system such as a memory tester. It thus does not need time-consuming operation to make a probe contacted with an internal node and does not need to use expensive system such as EB tester. Therefore, measurement of bit-line read-out potential can be performed with low-cost.

Figure 2:
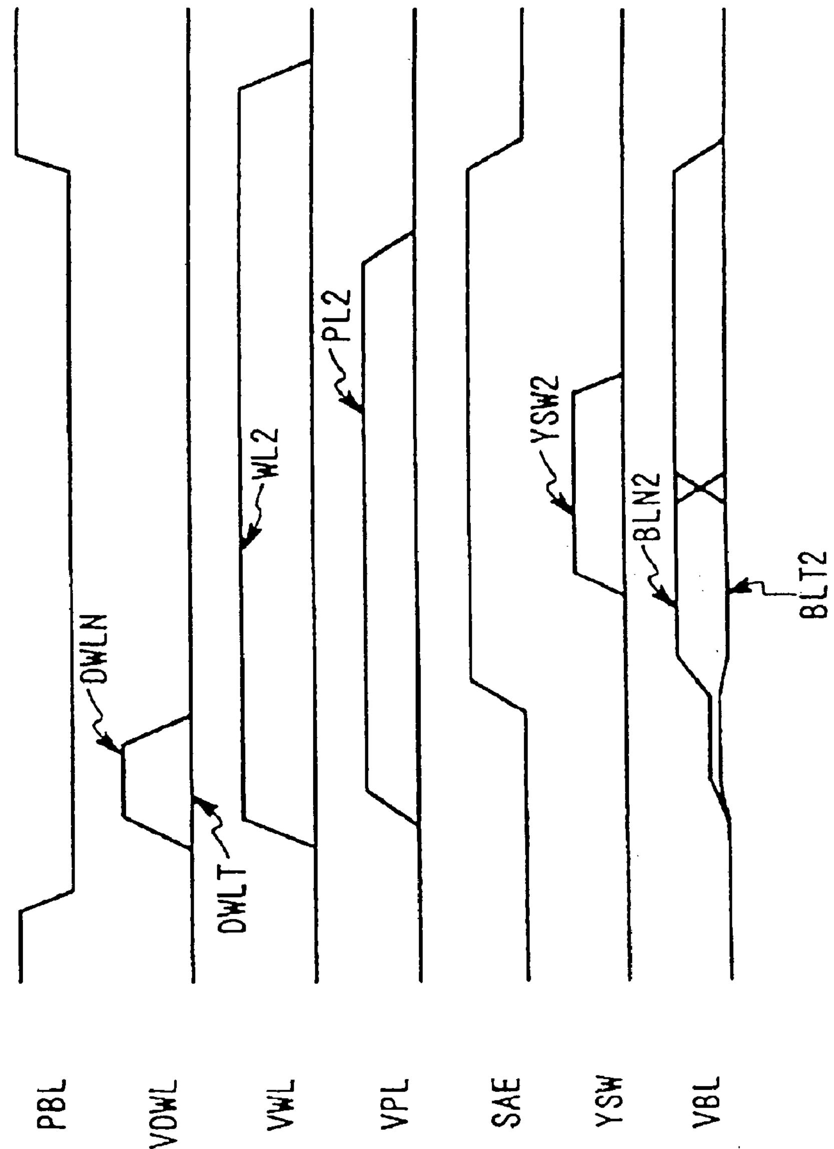
FIG. 2 is a timing chart for describing operation of a conventional ferroelectric memory.
Figure 3:
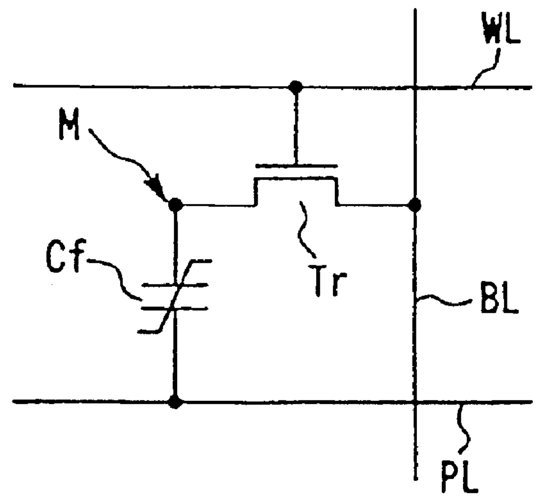
FIGS. 3(*a*) and 3(*b*) show illustrations for describing problems that conventional ferroelectric memories have.
Figure 3:
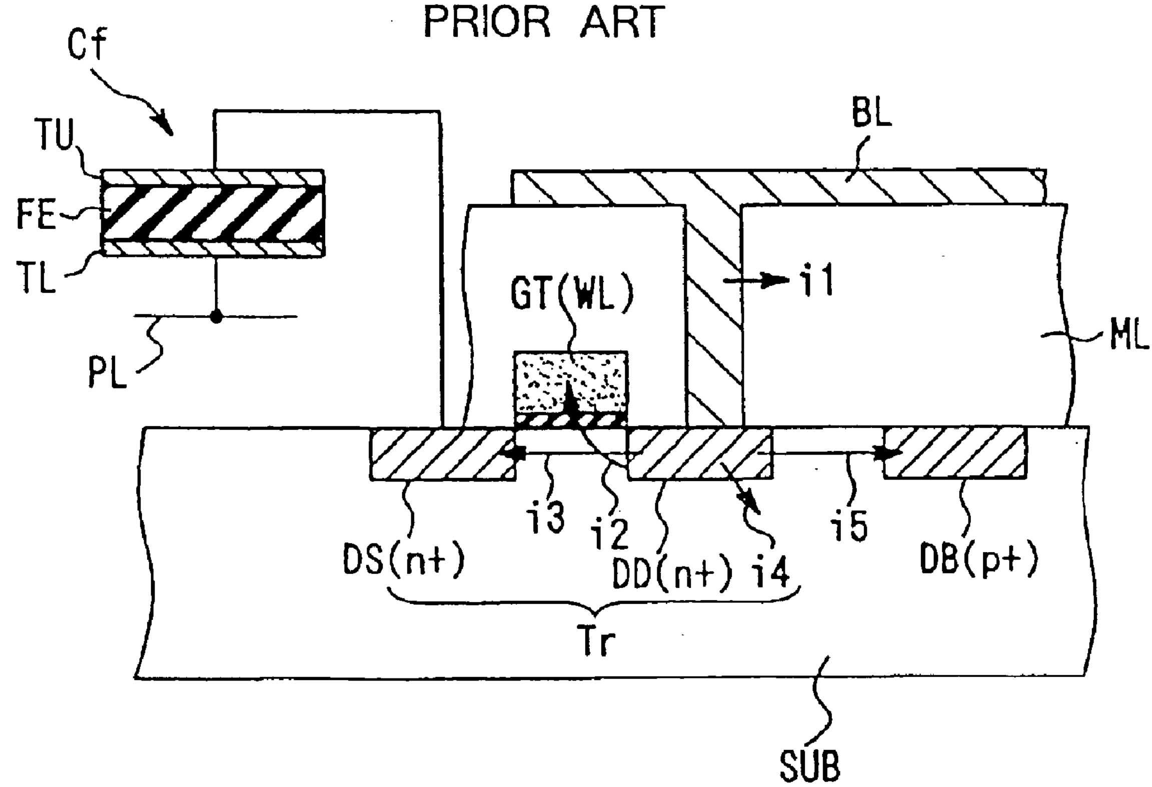

Additionally, according to embodiment 1 and 2 described above, first, load for the measurement part, which is added to a bit-line in measurement of bit-line read-out potential, is on the order of load for one transistor, or on the order of load for a sample capacitor having capacitance substantially lower than the bit-line capacitance. Therefore, increase in capacitive load due to measuring part is negligible. Second, any current load is used. Third, time period when data is read out to bit-line, may be substantially same as time period for operation for conventional semiconductor memory devices. For example, in the case of embodiment 1 above described, when comparing the operation timing chart in FIG. 2 according to a conventional device and the operation timing chart in FIG. 7 according to the invention, it is easily understood there is almost no difference in time period for read-out of data signal to bit-line between the charts. In the case of embodiment 2 described above, time period when data is read out to bit-line, may be on the order of time when the bit-line read-out potential is transferred to a sample hold circuit. Therefore it may be almost same as operation of conventional semiconductor memory device. It is thus possible to precisely measure bit-line read-out potential without influence of read-out potential variation due to bit-line leak or the like.

While embodiments according to the invention have been described, the invention is not limited to the embodiments and any design modification within scope not departing from spirits of the invention is also included in the invention. For example, while embodiment 1 is an example of a ferroelectric memory with an arrangement wherein reference potential occurs on one of bit-lines pairing with each other, the invention is not limited to the example and may be applied to a semiconductor memory device wherein reference potential is generated in outside of the memory cell array.

In embodiment 2, bit-line read-out potential is held by a sample hold circuit, the invention is not limited to it and each bit-line read-out potential can be received at the gate of a transistor, for example, forming source follower, with the source being pulled out.

As described above, the invention provides following effects:

Since a semiconductor memory device comprises a reference potential setup circuit part for setting up potential assigned from outside of the device as potential of reference signal that is to be reference for amplification of data signal occurring on bit-line, value of data signal occurring on bit-line can be indirectly obtained without influence on the data signal, by comparing in magnitude the data signal occurring on the bit-line and reference signal. Therefore, it is possible to precisely measure analog data signal potential read out from a memory cell to bit-line (bit-line read-out potential).

Furthermore, since the semiconductor memory device comprises a signal hold circuit for taking and holding data signal read out to bit-line, potential of the data signal itself can be directly obtained with minimizing influence on the data signal. Therefore, it is possible to precisely measure analog data signal potential read out from a memory cell to bit-line (bit-line read-out potential).

While preferred embodiments of the present invention have been described using specific terms, such description is for illustrative purposes only, and it is to be understood that changes and variations may be made without departing from the sprit or scope of the following claims.

What is claimed is:

1. A semiconductor memory device comprising:

a memory cell array formed by arranging memory cells in a matrix;

a plurality of word-lines for selecting each row of the memory cell array;

a plurality of bit-lines for carrying a data signal that is output by a memory cell belonging to each column of the memory cell array;

a reference signal generator part for generating a reference signal when amplifying a data signal occurring on the bit-line;

an amplifier part for amplifying the data signal occurring on the bit-line when comparing it with the reference signal; and a reference potential setup circuit part for setting up a potential assigned from outside of said semiconductor memory device as a potential of the reference signal.

2. The semiconductor memory device according to claim 1, wherein the reference potential setup circuit part comprises:

a transistor in which a drain terminal is connected to a bit-line in the memory cell array that is a line having the reference signal, the potential assigned from outside of said semiconductor memory device is provided to a source terminal, and a control signal activated in measurement of bit-line potential is provided to a gate terminal.

3. The semiconductor memory device according to claim 2, wherein the device comprises at least one of the functions implemented by a control part, a determination part, a storage part and a statistical process part and wherein said function of said reference signal control part is generating a potential between a source potential and a ground potential when varying the potential in one direction, applying it to the reference potential setup circuit, and controlling the potential of the reference signal;

said function of said reference potential setup circuit part is setting up a potential assigned from outside of said semiconductor memory device as a potential of the reference signal;

said function of said control part is controlling a series of steps for generating an address for the semiconductor memory device and reading a data signal from the memory cell;

said function of said determination part is determining a logic value of a data signal amplified by the amplifier part;

said function of said storage part is storing a potential value of the reference signal when the logic value determined by the determination part is inverted; and said function of said statistical process part is statistically processing the value of the potential stored in the storage part.

4. The semiconductor memory device according to claim 1, wherein the device comprises at least one of the functions implemented by a control part, a determination part, a storage part and a statistical process part and wherein said function of said reference signal control part is generating a potential between a source potential and a ground potential when varying the potential in one direction, applying it to the reference potential set up circuit, and controlling the potential of the reference signal;

said function of said reference potential setup circuit part is setting up a potential assigned from outside of said semiconductor memory device as a potential of the reference signal;

said function of said control part is controlling a series of steps for generating an address for the semiconductor memory device and reading a data signal from the n=memory cell;

said function of said determination part is determining a logic value of a data signal amplified by the amplifier part;

said function of said storage part is storing a potential value of the reference signal when the logic value determined by the determination part is inverted; and said function of said statistical process part is statistically processing the value of the potential stored in the storage part.

5. A testing system for testing a semiconductor memory device comprising a memory cell array formed by arranging memory cells in a matrix, a plurality of word-lines for selecting each row of the memory cell array, a plurality of bit-lines for carrying a data signal that is output by a memory cell belonging to each column of the memory cell array, a reference signal generator part for generating a reference signal when amplifying the data signal occurring on the bit-line, an amplifier part for amplifying the data signal occurring on the bit-line when comparing it with the reference signal, and a reference potential setup circuit part comprising:

a reference signal control part for generating a potential between a source potential and a ground potential when varying the potential in one direction, applying it to the reference potential setup circuit, and controlling the potential of the reference signal;

a control part for controlling a series of steps for generating an address for the semiconductor memory device and reading a data signal from the memory cell;

a determination part for determining a logic value of a data signal amplified by the amplifier part;

a storage part for storing a potential value of the reference signal when the logic value determined by the determination part is inverted; and a statistical process part for statistically processing the value of the potential stored in the storage part:

wherein the reference potential setup circuit part for setting up a potential assigned from outside of said semiconductor memory device as a potential of the reference signal.

6. A testing method for testing a semiconductor memory device comprising a memory cell array formed by arranging memory cells in a matrix, a plurality of word-lines for selecting each row of the memory cell array, a plurality of bit-lines for carrying a data signal that is output by a memory cell belonging to each column of the memory cell array, a reference signal generator part for generating a reference signal when amplifying a data signal occurring on the bit-line, an amplifier part for amplifying the data signal occurring on the bit-line when comparing it with the reference signal, and a reference potential setup circuit part comprising:

(a) setting up a potential assigned from outside of said semiconductor memory device as potential of the reference signal;

(b) reading out a data signal from the memory cell to the bit-line; and (c) comparing for magnitude relationship in potential, the reference signal and data signal compared by the amplifying part to obtain the potential of the reference signal when the magnitude relationship inverts.

7. A semiconductor memory device comprising:

a memory cell array formed by arranging memory cells in a matrix;

a plurality of word-lines for selecting each row of the memory cell array;

a plurality of bit-lines for carrying a data signal that is output by a memory cell belonging to each column of the memory cell array, and an amplifier part for amplifying the data signal occurring on the bit-line, and a signal hold circuit for taking and holding the data signal read out to the bit-line.

8. The semiconductor memory device according to claim 7, wherein the signal hold circuit comprises a sample hold circuit.

9. The semiconductor memory device according to claim 8, wherein the device comprises at least one of the functions implemented by a first and second control parts, a conversion part, a storage part, and a statistical process part and wherein:

said function of said first control part is controlling a series of steps for generating an address to provide it to the semiconductor memory device and reading out a data signal from the memory cell;

said function of said second control part is controlling such that the signal hold circuit takes data signal read out to the bit-line;

said function of said conversion part is for A/D converting the data signal taken to the signal hold circuit;

said function of said storage part is storing data signal AID converted by the data conversion part; and said function of said statistical process part is statistically processing data stored in the storage part.

10. The semiconductor memory device according to claim 8, wherein said sample hold circuit comprises a capacitor and a voltage follower, a potential on the bit-line being selectively input to the voltage follower, the capacitor being arranged to maintain the selectively input potential of the bit line as input to the voltage follower, wherein a capacitance of said capacitor is lower than a parasitic capacitance of the bit-line.

11. The semiconductor memory device according to claim 7 wherein the device comprises at least one of the functions implemented by a first and second control parts, a conversion part, a storage part, and a statistical process part and wherein said function of said first control part is controlling a series of steps for generating an address to provide it to the semiconductor memory device and reading out a data signal from the memory cell;

said function of said second control part is controlling such that the signal hold circuit takes data signal read out to the bit-line;

said function of said conversion part is for A/D converting the data signal taken to the signal hold circuit;

said function of said storage part is storing data signal A/D converted by the data conversion part; and said function of said statistical process part is statistically processing data stored in the storage part.

12. A testing system for testing a semiconductor memory device comprising a memory cell array formed by arranging memory cells in a matrix, a plurality of word-lines for selecting each row of the memory cell array, a plurality of bit-lines for carrying data signal that is output by a memory cell belonging to each column of the memory cell array, an amplifier part for amplifying the data signal occurring on the bit-line, and a signal hold circuit for taking and holding a signal on the bit-line, comprising:

a first control part for controlling a series of steps for generating an address to provide it to the semiconductor memory device and reading out a data signal from the memory cell;

a second control part for controlling such that the signal hold circuit takes data signal read out to the bit-line;

a conversion part for A/D converting the data signal taken to the signal hold circuit;

a storage part for storing data signal AID converted by the data conversion part; and a statistical process part for statistically processing data stored in the storage part.

13. A testing method for testing a semiconductor memory device comprising a memory cell array formed by arranging memory cells in a matrix, a plurality of word-lines for selecting each row of the memory cell array, a plurality of bit-lines for carrying a data signal that is output by a memory cell belonging to each column of the memory cell array, an amplifier part for amplifying the data signal occurring on the bit-line, and a signal hold circuit for taking and holding signal on the bit-line, comprising:

(a) reading out a data signal from the memory cell to the bit-line;

(b) taking the data signal read out to the bit-line, to the signal hold circuit; and (c) reading out the potential of data signal taken to the signal hold circuit, to outside.

* * * * *